United States Patent
Fillion et al.

(10) Patent No.: US 6,306,680 B1
(45) Date of Patent: Oct. 23, 2001

(54) POWER OVERLAY CHIP SCALE PACKAGES FOR DISCRETE POWER DEVICES

(75) Inventors: Raymond Albert Fillion, Schenectady; Barry Scott Whitmore, Waterford; Charles Steven Korman, Schenectady, all of NY (US); Albert Andreas Maria Esser, Delafield, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/255,412

(22) Filed: Feb. 22, 1999

(51) Int. Cl.[7] .......................... H01L 21/44; H01L 21/48; H01L 21/50; H01L 21/30
(52) U.S. Cl. .......................... 438/106; 438/107; 438/108; 438/109; 438/456; 438/617
(58) Field of Search ..................................... 438/107, 109, 438/110, 112, 121, 456, 612, 617, 106, 108, 124, 125, 126, 113

(56) References Cited

U.S. PATENT DOCUMENTS

| | | | |
|---|---|---|---|
| 5,324,687 | * | 6/1994 | Wojnarowski ........................ 437/225 |
| 5,353,195 | * | 10/1994 | Fillion et al. ......................... 361/760 |
| 5,353,498 | | 10/1994 | Fillion et al. ........................... 29/840 |
| 5,497,033 | * | 3/1996 | Fillion et al. ......................... 257/723 |
| 5,518,964 | * | 5/1996 | DiStefano et al. ................... 438/113 |
| 5,532,512 | * | 7/1996 | Fllion et al. ......................... 257/686 |
| 5,637,922 | * | 6/1997 | Fillion et al. ......................... 257/728 |
| 5,798,286 | * | 8/1998 | Faraci et al. ......................... 438/113 |
| 5,801,073 | * | 9/1998 | Robbins et al. ....................... 438/125 |
| 5,841,193 | * | 11/1998 | Eichelberge ......................... 257/723 |
| 5,854,085 | * | 12/1998 | Raab et al. ........................... 438/123 |
| 5,915,170 | * | 6/1999 | Raab et al. ........................... 438/118 |
| 6,114,753 | * | 9/2000 | Nagai et al. ......................... 257/668 |
| 6,166,436 | * | 12/2000 | Maeda et al. ......................... 257/723 |
| 6,194,290 | * | 2/2001 | Kub et al. ............................. 438/455 |

* cited by examiner

Primary Examiner—Matthew Smith
Assistant Examiner—Chuong Luu

(57) ABSTRACT

A power semiconductor device package includes at least one power semiconductor device mounted onto at least one electrically and thermally conductive spacer having an upper end surface bonded to a back surface of the device; a substrate of hardened substrate molding material surrounding the semiconductor device and the spacer except for an active major surface of the device and an lower end surface of the spacer, a dielectric film overlying the device active major surface and a top side of the substrate, the dielectric layer having a plurality of holes aligned with predetermined ones of the contact pads; a top side patterned metal layer on the dielectric film including portions extending into the holes electrically and thermally connected to contact pads of the device; and a backside metal layer on a substrate bottom side electrically and thermally connected to the spacer lower end surface. Optional through-post structures can be employed to bring all electrical connections either to the top side of the device package or the bottom side. Optional heat sinks can be mounted to the top side, the bottom side, or both sides.

26 Claims, 22 Drawing Sheets

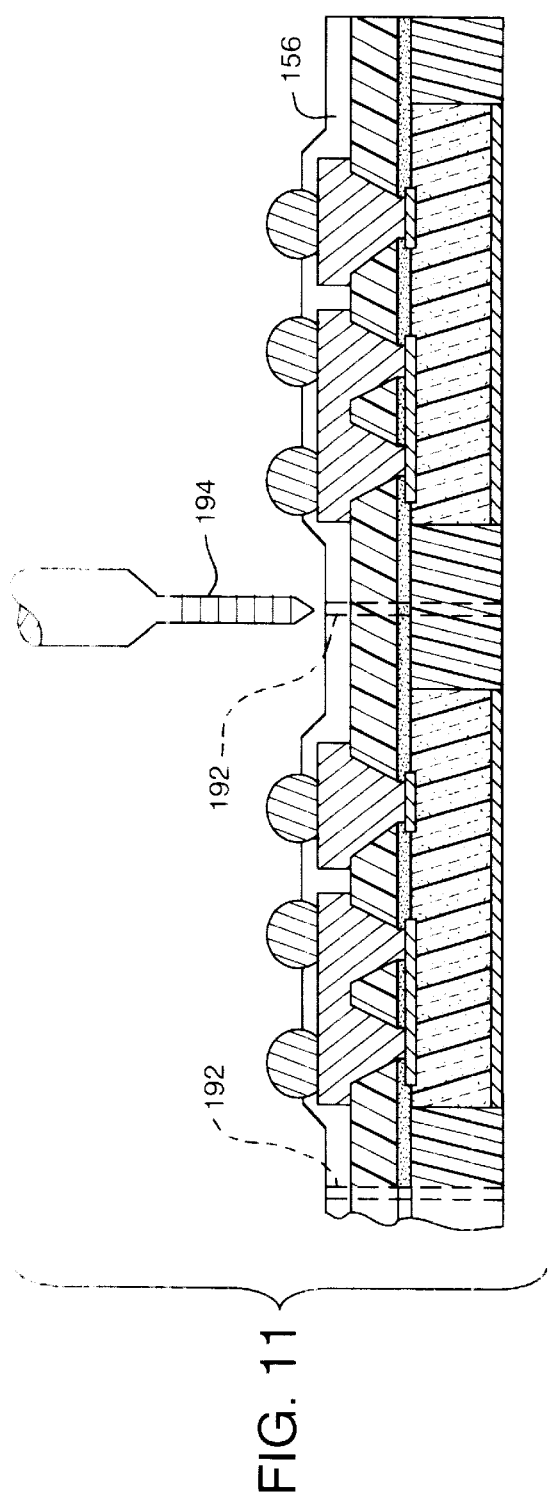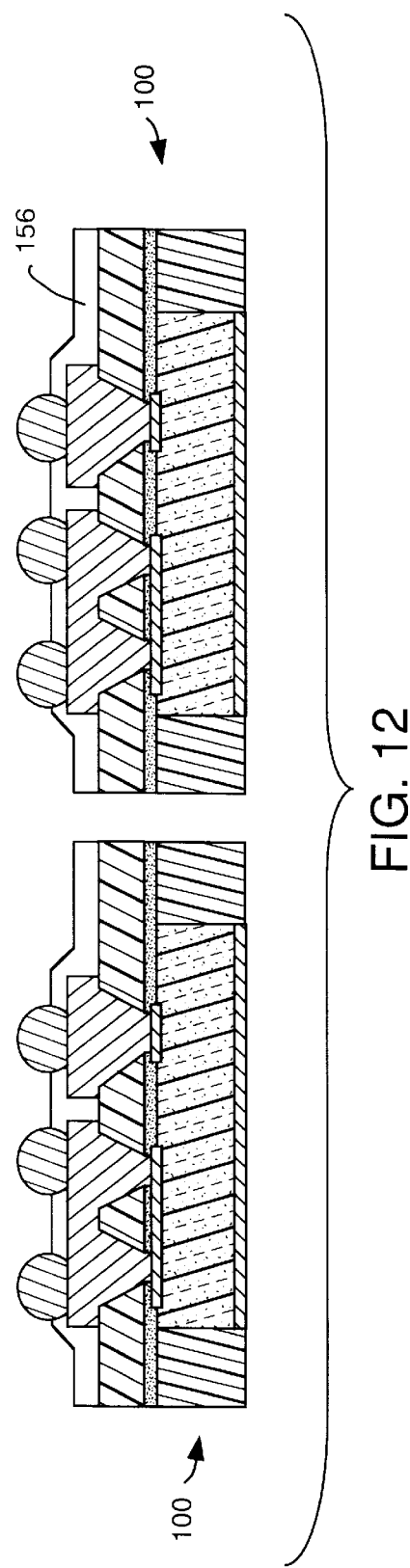

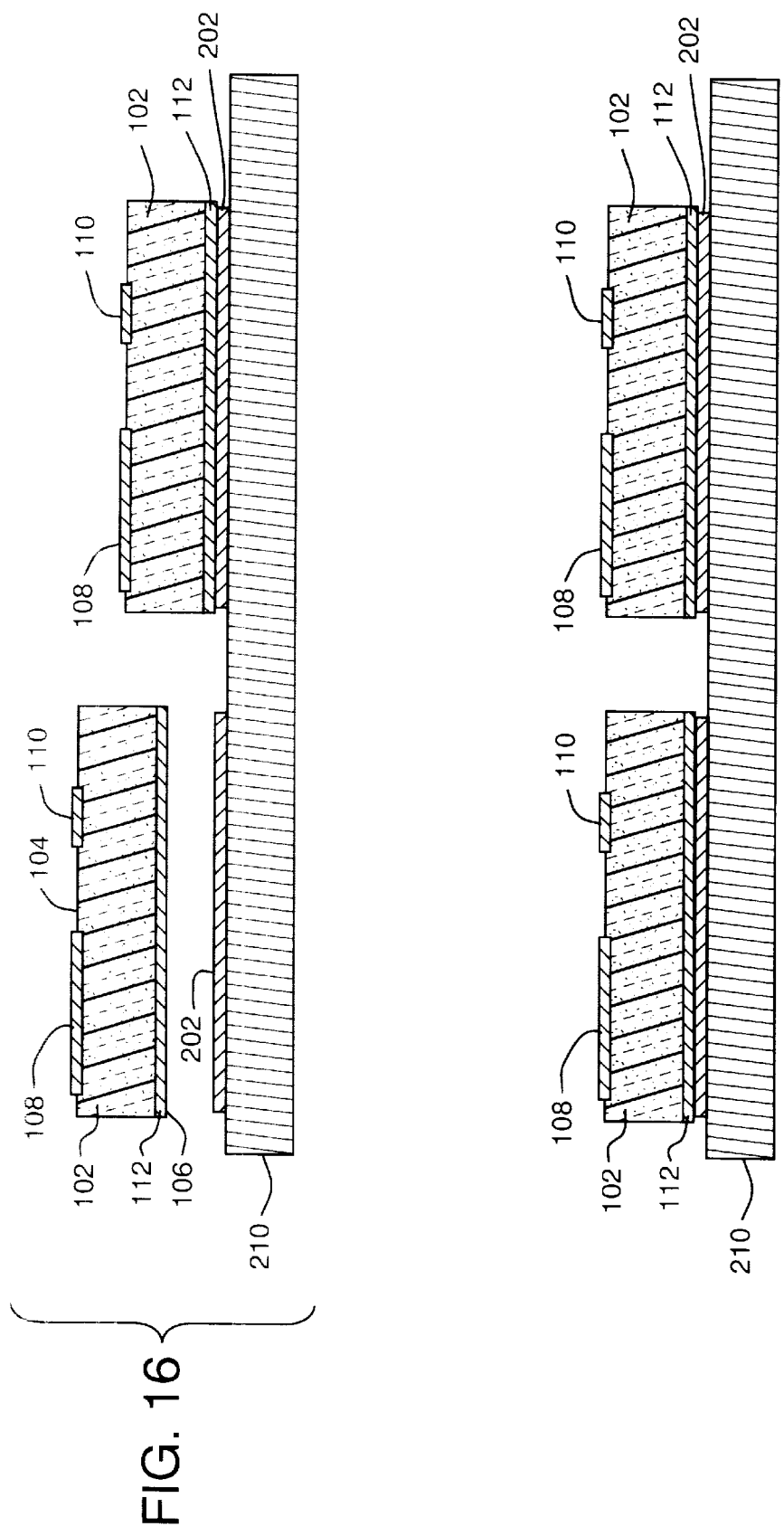

POWER OVERLAY CHIP SCALE PACKAGES FOR DISCRETE POWER DEVICES

BACKGROUND OF THE INVENTION

This invention relates to the packaging of power semiconductor devices in both single chip and multiple chip packages, with enhanced electrical and thermal characteristics.

One approach to packaging power semiconductor devices is shown in Fillion et al U.S. Pat. No. 5,637,922, wherein power semiconductor devices are mounted to a direct bond substrate, and high density interconnect (HDI) techniques are employed to form electrical connections to device top contact pads, using relatively thick copper metallization. The structures of Pat. No. 5,637,922 have the advantages of excellent thermal conductivity for carrying heat away from the bottom of the semiconductor device, the elimination of electrical parasites which would otherwise be caused by wire bond connections, reliability and robustness. Cost however is a factor, as well as the inability to mix devices of different thicknesses. In addition, it is desirable to provide semiconductor device packages which are flat on both sides, to facilitate the attachment of heat sink structures to both sides.

BRIEF SUMMARY OF THE INVENTION

In exemplary embodiments of the invention, a number of techniques are employed, including the use of pre-punched through holes, encapsulation to form substrate structures, and grinding to achieve planarization. Through-post structures are employed to alternatively bring all electrical connections either to the top side of a device package, or the bottom side. Heat sinks may be mounted to the top side, the bottom side, or both.

BRIEF DESCRIPTION OF THE DRAWINGS

FIG. 11 is a sectional side view of a portion of the structure of FIG. 10, immediately prior to sawing;

FIG. 12 depicts two of the FIG. 10 devices after sawing;

FIG. 16 is a cross-sectional view depicting initial steps in an alternative method embodying the invention wherein power devices are pre-attached to a spacer;

FIG. 17 depicts an intermediate structure after the bonding step of FIG. 16;

DETAILED DESCRIPTION OF THE INVENTION

Figure 3:
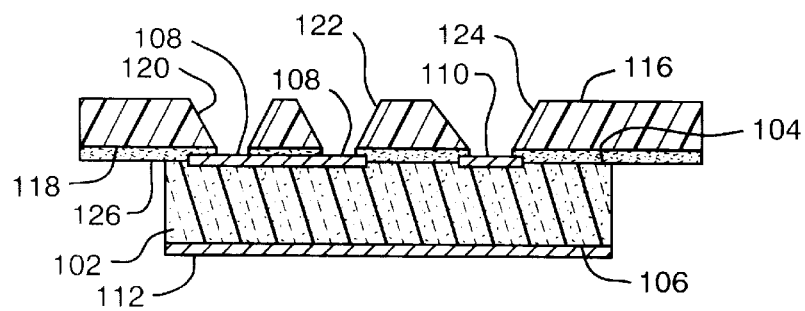
FIG. 3 depicts a further step including the mounting of a semiconductor device.
Figure 4:
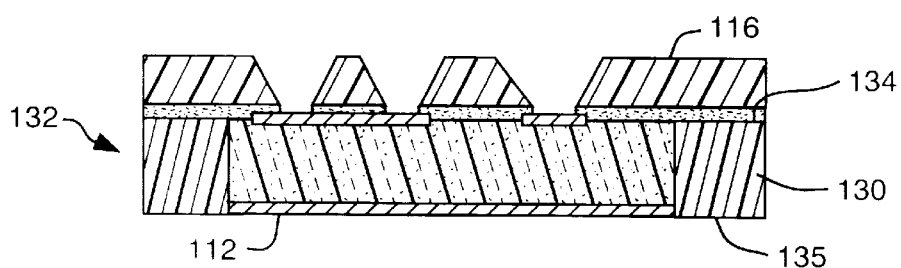
FIG. 4 depicts an encapsulation step.
Figure 5:
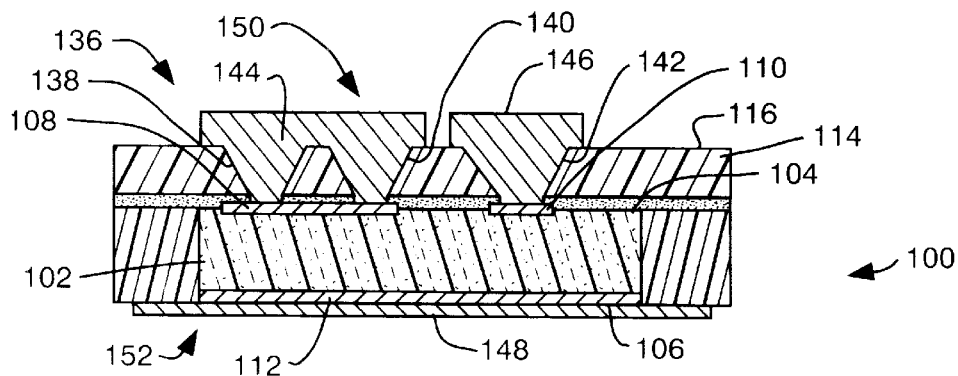
FIG. 5 depicts further steps in the first method embodying the invention, as well as the resultant package.

Referring to FIGS. 1–5, illustrated are steps of a fabrication method, and a resultant power semiconductor device package 100 (FIG. 5). For convenience of illustration, FIGS. 1–5, which are sectional side views, are all in the same orientation. However, during the actual fabrication process, typically the structure illustrated in FIGS. 1, 2 and 3 would be inverted during processing, as well as the structure of FIG. 4 during a portion of the process.

Package 100 is for a power semiconductor device 102 which is representative of power semiconductor devices of various types, such as but not limited to power MOSFETs (metal oxide field effect transistors), and IGBTs (insulated gate bipolar transistors) which are employed in power switching applications. Prior to any packaging or interconnection, these devices 102 generally are in the form of a semiconductor chip having an active major surface 104, which may also be referred to as the top side, and an opposite major surface 106, which may also be referred to as the bottom side. Active major surface 104 is patterned and has metallized (typically aluminum) I/O (input/output) pads 108 and 110 including, in the case of a power semiconductor device 102, at least two terminals, namely, a device main terminal such as a source terminal represented by contact pad 108, and a control terminal such as a gate terminal, represented by contact pad 110. In typical devices, in order to provide low impedance connections, there is either a large main terminal 108 on active major surface 104, or there are multiple main terminal pads 108, all to be connected in parallel, and additionally one or more control terminal pads 110, likewise to be connected in parallel. The uniform opposite major surface 106 typically comprises another device main terminal 112, such as a drain terminal, which is of a solderable metal such as chrome/nickel/silver.

In one method embodying the invention, such a power semiconductor device 102 is provided, and incorporated into package 100.

Figure 1:
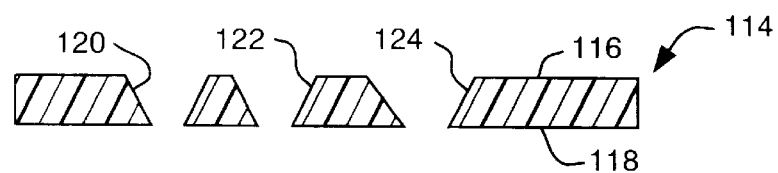
FIG. 1 is a sectional side view of a sheet of dielectric film, depicting an initial step of a fabricating method embodying the invention.

Referring in particular to FIG. 1, dielectric film 114 is provided, film 114 having first 116 and second 118 sides. Film 114 may comprise a polymeric film, such as KAPTON, a trademark of E.I. duPont de Nemours and Co. Film 114 is approximately 25 to 75 microns thick. In the final device package 100 (FIG. 5), first side 116 is on top; however, during the processing steps described with reference to FIGS. 1, 2, and 3, and FIG. 4, in part, the second side 118 is on top, and the drawing figures are inverted.

Multiple holes, such as representative through holes 120, 122 and 124, are formed through dielectric film 114, by any suitable means, such as a standard mechanical punch process, water set punch process, or chemical etch process, for example. Through holes 120, 122 and 124 can be circular, or of another suitable shape. The side walls of the through holes can be tapered as shown, be straight, or include a more complex profile such as achieved with an etching process. Through holes 120, 122 and 124 have diameters of 50 microns or larger, preferably larger than 100 microns, to simply fabrication.

As is described in greater detail hereinbelow, representative through holes 120 and 122, and device main terminal 108 on active major surface 104, are in alignment. Device main terminal 108 may be a source terminal 108, and serves as a high current terminal. The number and size of through holes 120 and 122 depend upon device 102 size, contact pad 108 size and shape, and the current requirements of device 102. Typically, for a device 102 carrying from 10 to 500 amps of ON current, 10 to 100 through holes 120 and 122 with diameters in the range of 100 to 500 microns could be employed. Fewer through holes 120 and 122 could be employed with larger openings, such as from 1 to 10 through holes, with diameters within the range of 500 to 5,000 microns. Thus, in an extreme case a single large through hole 120 or 122 may be provided for alignment with representative drain source contact 108. Multiple connections formed with through holes 120 and 122 to a single contact pad provide a connection which is superior to a single wire bond.

Active major surface 104 of device 102 is bonded to second side 118 of the sheet of dielectric film 114, with contact pads 108 and 110 and corresponding ones of through holes 120, 122 and 124 in alignment as described above.

Figure 2:
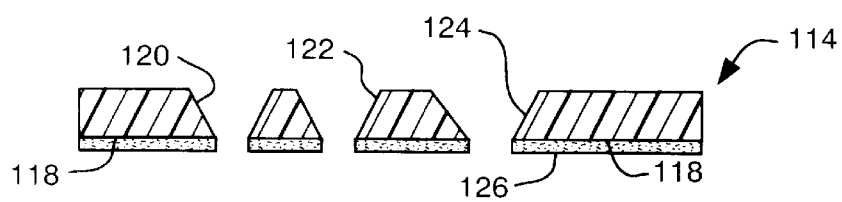
FIG. 2 depicts a subsequent step of depositing of an adhesive layer.

More particularly, with reference to FIG. 2, an adhesive layer 126 is deposited on to second side 118 of dielectric film 114, which second side 118 is on the underside of film 114 in the orientation of FIG. 2, but would be oriented as the top side during a typical fabrication process. Adhesive layer 126 can be either a thermoset or a thermoplastic polymeric material, preferably a low temperature cure thermoset to minimize high temperature processing. A suitable material for adhesive layer 126, for example is an ULTRADEL™ adhesion promoter (ULTRADEL is a trademark of Amoco Chemicals) with a thickness within the approximate range of 10 to 20 microns.

FIG. 3 shows power semiconductor device 102, still un-packaged, mounted active major surface 104 down (since the orientation of FIG. 3 is inverted) onto adhesive layer 126 on second side 118 of dielectric film 114. Device 102 contact pads 108 and 110 are aligned to preformed through holes 120, 122 and 124 in film 114. Device 102 may be bonded in place using a thermal curing cycle and, if required, a vacuum to facilitate removal of entrapped air and outgassing from adhesive 126. Alternative curing options include a microwave cure and an ultraviolet light cure, for example.

With reference to FIG. 4, which likewise is inverted in orientation, a dielectric encapsulant 130 is molded around semiconductor device 102 on second side 118 of dielectric film 114. Molding material to form dielectric encapsulant 130 is poured or injected into a mold form (not shown) in a manner optimizing environmental conditions such as temperature, atmosphere, and pressure, to minimize voids, stresses, shrinkage and other potential defects. Typically, the process step of molding dielectric encapsulant 130 is preformed in a vacuum, preferably at a processing temperature that does not exceed 300° C.

Dielectric encapsulant 130 may comprise a plastic encapsulant such as an epoxy with a high level of inorganic particle fill (such as 70% silica) that is molded around device 102 and thermally cured (or cured with another process such as UV light cure or microwave cure) to form a protective structure for the resultant device package 100. Particularly in the context of individual devices which are subsequently sawed apart as is described hereinbelow with reference to FIGS. 10, 11 and 12, dielectric encapsulant 130 may be viewed as comprising a device carrier 132 or a device substrate 192, which has a top side 134 and a bottom side 135.

Still referring to FIG. 4, but now oriented as is actually shown in FIG. 4 with active major surface 104 facing up, in order to remove any residue of adhesive 126 that may have flowed onto contact pads 108 and 110, the first surface 116 (top) of dielectric film 114 and exposed through holes 120, 122 and 124 are subjected to a polymer etch processing such as a plasma etch, an ion etch or a chemical etch.

Next, and with reference to FIG. 5, a patterned electrically conductive layer, generally designated 136, is formed on first side 116 of dielectric film 114, the top side in the orientation of FIG. 5. More particularly, portions 138, 140 and 142 of patterned electrically conductive layer 136 extend through the through holes 120, 122 and 124 as vias 138, 140 and 142 in electrical contact with device 102 contact pads 108 and 110. Other portions of patterned electrically conductive layer 136 define package interconnect regions 144 and 146. Package interconnect region 144 serves as a source interconnect, and package contact region 146 serves as a gate interconnect.

As exemplary processing steps, to form patterned electrically conductive layer 136, top surface 116 of film 114, the side walls of the through holes 120, 122 and 124, and exposed portions of device contact pads 108 and 110 are metallized using a sputtering process or an electroless plating process. Initial metallization forms a seed layer of metal. This seed layer can be a barrier metal such as Ti, Cr or Ni, or the seed layer can be a non-barrier metal such as Cu. A thick Cu layer is plated up on the seed layer to form package interconnect regions 144 and 146 over selected areas of the top surface 116, and into the through holes 120, 122 and 124 to form vias 138, 140 and 142 in electrical contact with device contact pads 108 and 110. Exposed metal areas such as interconnect regions 144 and 146 are, for high current power devices, typically 75 to 250 microns thick, and, for lower current devices, in the range of 10 to 50 microns in thickness. Interconnect region 144 in electrical contact with contact pad 108 can serve as a first package main terminal contact, and has sufficient current carrying capability for the device 102.

Preferably, a patterned plate-up process is used where a photo-sensitive resist (not shown) is deposited over the seed layer, and then photopatterned and selectively etched to form the desired pattern of metallization. Exposed metallization areas are electroplated to the desired thickness. Following the metal plating process, the developed resist is washed off and the exposed seed layer metal is chemically etched, completing the patterning of the electrically conductive layer 136. In an alternative process, the entire top surface is uniformly plated, a photosensitive resist is deposited, the photosensitive resist is patterned, and the metal is pattern etched to form the desired pattern of metallization.

Patterned electrically conductive layer 136, in conjunction with the multiple through holes 120, 122 and 124, provides both high electrical current capability and an efficient thermally conductive path for cooling device 102 from active major surface 104.

Device 102 may include an electrically conductive device main terminal 112 as shown. If the device does not include such a terminal or if desired for improved adhesion or other reasons, electrically and thermally conductive optional metallization 148 can be formed over device 102 on opposite major surface 106. Metallization 148 for example can be formed by electroplating or sputtering. Metallization 148 can serve as a second package main terminal contact and has sufficient current carrying capability for the device 102.

The resultant device package 100 provides high current-carrying capability, and a low impedance thermal path for conducting heat away from active major surface 104. As described hereinbelow in detail, heat sink structures, electrical interconnect structures, or both, can be mounted to package top 150, bottom 152, or both.

Figure 6:
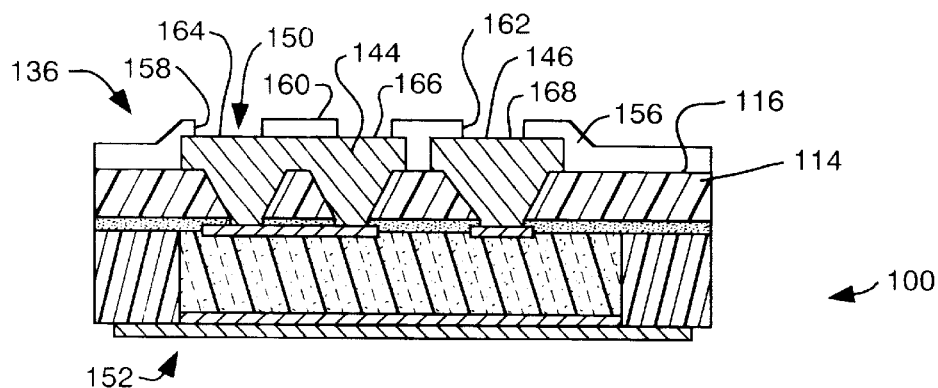
FIG. 6 depicts a step of applying a patterned solder mask to the device package of FIG. 5.

With reference to FIGS. 6, 7, 8 and 9, depicted is one example of the manner in which package 100 is prepared for interconnection to interconnect regions 144 and 146. In FIG. 6, a patterned solder mask 156 or passivation layer 156 is formed over patterned electrically conductive layer 136 on first side 116 of dielectric film 114, with openings 158, 160 and 162 in solder mask 156 defining areas for electrical connection to package interconnect regions 144 and 146. Thus, solder mask 156 is applied to top surface 150 of package 100 over any non-metallized areas of top surface 150 and over selected areas of top side metallization 136. Areas not coated with solder mask or passivation 156 become exposed metal contact pads 164, 166 and 168 of the resulting power device package 100 with patterned solder mask 156.

Figure 7:
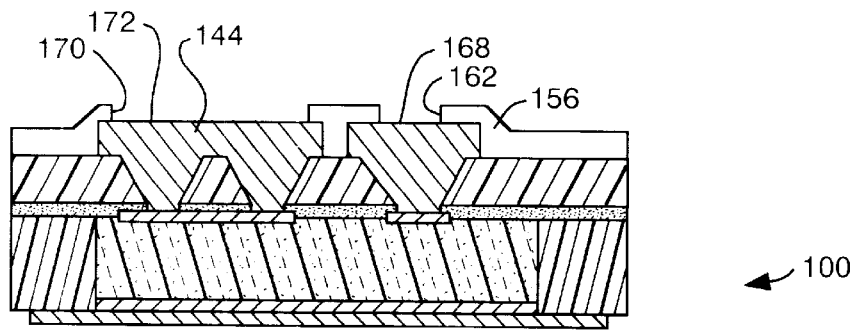
FIG. 7 as an alternative depicts another form of solder mask applied to the device package of FIG. 5.

FIG. 7 shows a slight modification of the FIG. 6 processing step and structure, differing in that there is a larger opening 170 in passivation or solder mask 156, defining a larger exposed metal contact pad 172 of the resulting power device package 100 with patterned solder mask 156.

Figure 8:
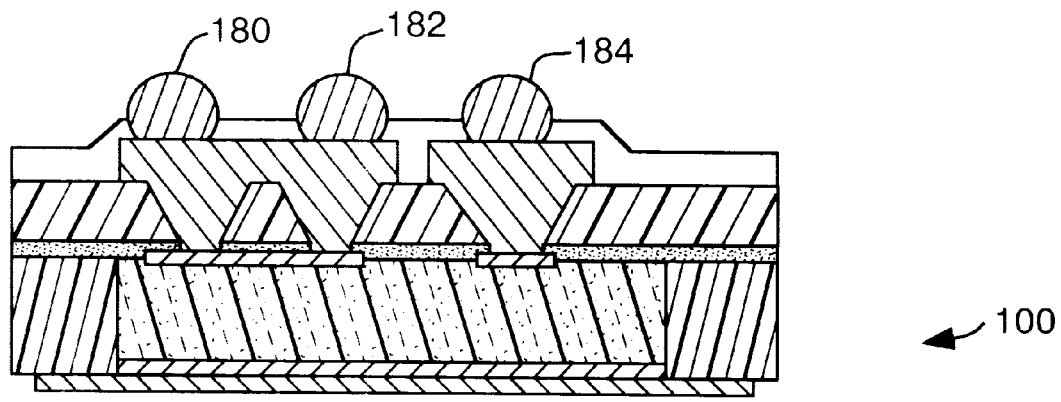
FIG. 8 depicts the addition of solder to the solder masked structure of FIG. 6.
Figure 9:
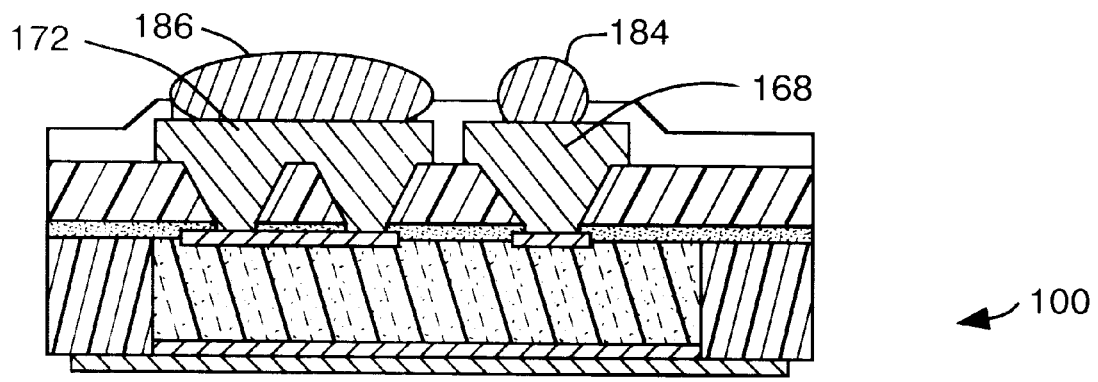
FIG. 9 depicts the addition of solder to the solder masked structure of FIG. 7.

FIG. 8 depicts the addition of solder to the package 100 with patterned solder mask 156 of FIG. 6, and FIG. 9 depicts the addition of solder to the package 100 with patterned solder mask 156 of FIG. 7 to facilitate subsequent connection to electrical interconnect structures, and heat sink structures. More particularly, in FIG. 8, solder 180, 182, and 184 is dispensed onto exposed metal contact pad 164, 166 and 168 portions of interconnect regions 144 and 146 for electrical connection of power device package 100 into a power circuit. Alternatively, solder flux can be applied to the exposed pads 164, 166, and 168 by a standard process such as dispensing using a stencil and solder sphere can be placed onto the flux and solder reflow attached to pads 164, 166, and 168.

Likewise, FIG. 9 depicts solder 186 and 184 dispensed onto exposed larger metal contact pad 172 and contact pad 168 portions of interconnect regions 144 and 146. In FIG. 8, solder 180, 182 and 184 is in the form of an array of solder spheres, deposited by any standard industry process, such as solder paste that is dispensed using a stencil, and reflowed. In larger areas as represented in FIG. 9, solder 186 can be dispensed as a solder preform, or as a solder paste forming a larger area of continuous solder.

Figure 10:
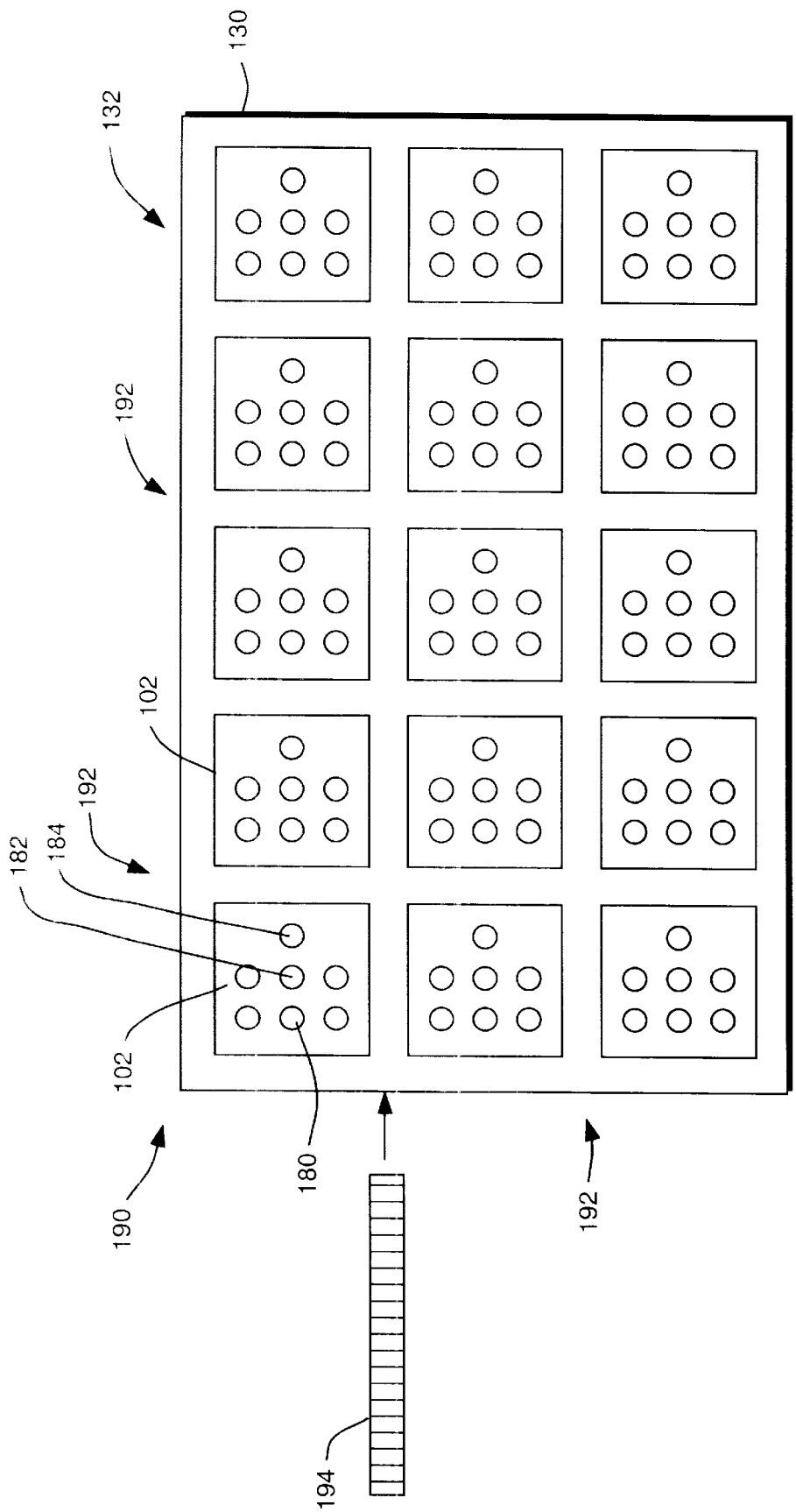
FIG. 10 is a plan view depicting an array of devices prior to being sawed apart.

FIGS. 10, 11 and 12 depict a modification of the process described hereinabove with reference to FIGS. 1–5, wherein an array 190 of power semiconductor devices 102 are encapsulated together within dielectric encapsulant 130 forming what may be viewed as device carrier 132, and then subsequently sawed apart to form singulated packaged power devices (FIG. 12), as an alternative to individually molding the devices as implied by FIG. 4. Thus, the plan view of FIG. 10 depicts an array 190 of devices 102 with patterned solder mask 156 (FIGS. 11 and 12) and solder spheres 180, 182 and 184, fabricated for example employing the process step sequence of FIGS. 1–6 and 8, but with multiple devices 102 encapsulated within a single body of encapsulant 130 comprising device carrier 132. Saw streets 192 are defined between device package 100 sites, forming paths for a saw blade 194 to cut each site into a separate device package 100.

The sawing process is typical of wafer sawing processes, where a thin (typically 5 to 25 mils wide) saw blade 194 or grinding blade 194 mechanically cuts through the entire structure, including through the dielectric encapsulant 130 and through dielectric film 114, in a series of horizontal and vertical swaths. FIG. 11 depicts a cross-section of two package 100 sites on the power device carrier 132 prior to sawing into individual units. FIG. 12 correspondingly depicts the two singulated power device packages 100 after sawing. Although FIGS. 10–12 depict sawing after the solder spheres are attached, an alternative sequence would have the sawing step occur prior to the solder sphere attachment.

Figure 13:
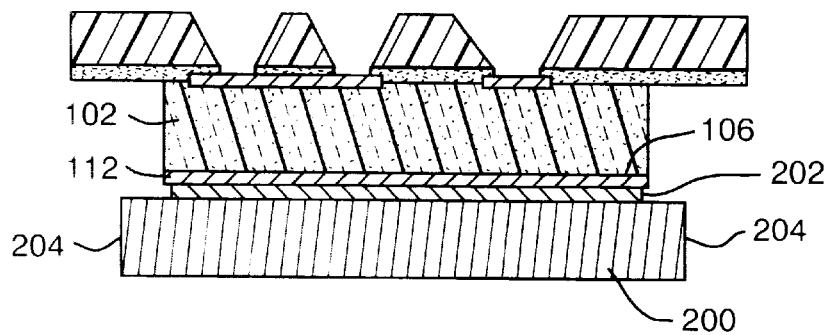
FIG. 13 is a sectional side view depicting an intermediate step in a modified process, including the bonding of a thermally conductive spacer.
Figure 14:
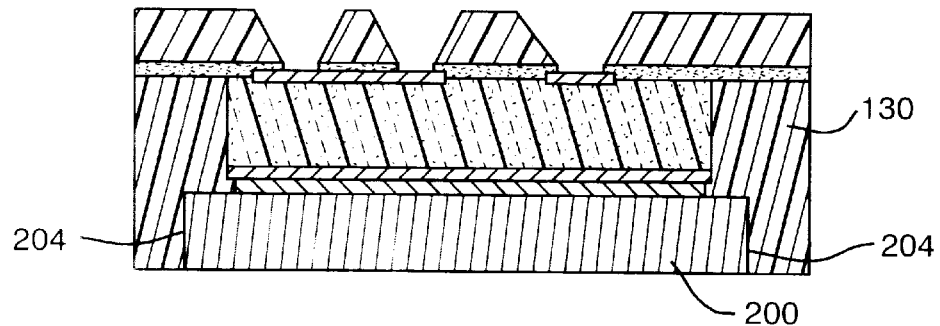
FIG. 14 depicts encapsulation of the structure of FIG. 13.
Figure 15:
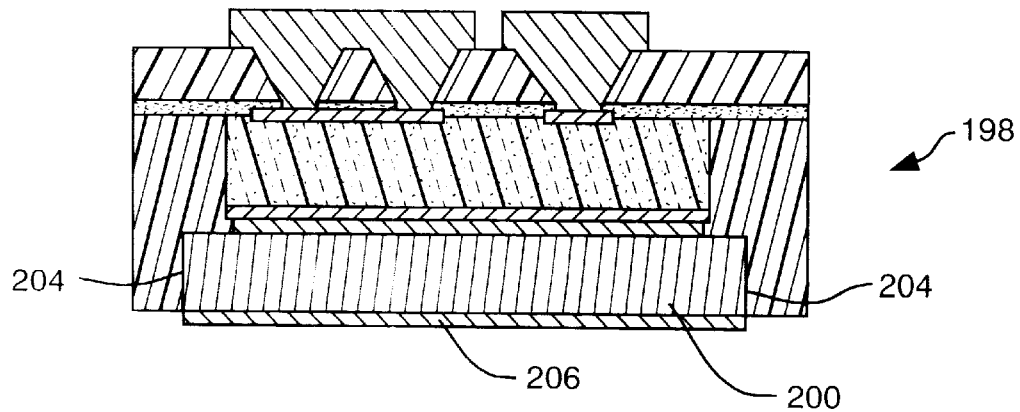
FIG. 15 depicts subsequent method steps, as well as a resultant device package.

FIGS. 13–15 depict a modification of the process, illustrating process steps that may be employed following the process step depicted in FIG. 3, as an alternative to the process steps depicted in FIGS. 4 and 5 to fabricate a package 198. FIGS. 13, 14 and 15 differ from FIGS. 4 and 5 in that, prior to molding dielectric encapsulant 130, an electrically and thermally conductive spacer 200 and opposite major surface 106 of device 102 and bonded to each other, in thermal and electrical contact, employing a bonding layer 202. Spacer 200 is accordingly electrically and thermally connected to device main terminal 112 (e.g. drain terminal) comprising opposite major surface 106 or back side 106 of power device 102. Bonding layer 202 may comprise solder applied as a preform, or as a dispensed layer of solder paste. Alternatively, bonding layer 202 may comprise a thermally and electrically conductive adhesive. Device 102 and spacer 200 may be bonded to each other either after device 102 is mounted onto to dielectric film 114 employing adhesive layer 126 as implied by the process steps of FIGS. 13–15 following the process steps of FIGS. 1–3, or before device 102 is mounted to dielectric film 114 employing adhesive layer as described hereinbelow with reference to FIGS. 16–19.

FIG. 14, which may be compared to FIG. 4, shows dielectric encapsulant 130 molded around both semiconductor device 102 and sides 204 of spacer 200 on second side 118 of dielectric film 114. The step of molding in FIG. 14 may be accomplished in a suitable mold (not shown) to define a single device, or may be part of a larger device carrier 132, subsequently sawed apart as described hereinabove with reference to FIGS. 10–12.

FIG. 15, which may generally be compared to FIG. 5, depicts the formation of patterned electrically conductive layer 136, in the same manner as is described above with reference to FIG. 5. Also in FIG. 15, an optional layer of solder 206 is applied to the exposed bottom surface of spacer 200.

FIGS. 16–19 depict process steps where device 102 and spacer 200 are bonded to each other before device 102 is mounted to dielectric film 114. In FIG. 16, representative power devices 102 are being placed onto a thermally and electrically conductive plate 210, employing a bonding layer 202 in the form of a thin solder layer 202, such that device main terminals 112 (e.g. drain terminals) comprising opposite major surface 106 are electrically and thermally connected to plate 210. FIG. 16 depicts devices 102 being placed, and FIG. 17 depicts the structure with the devices 102 bonded.

Figure 18:
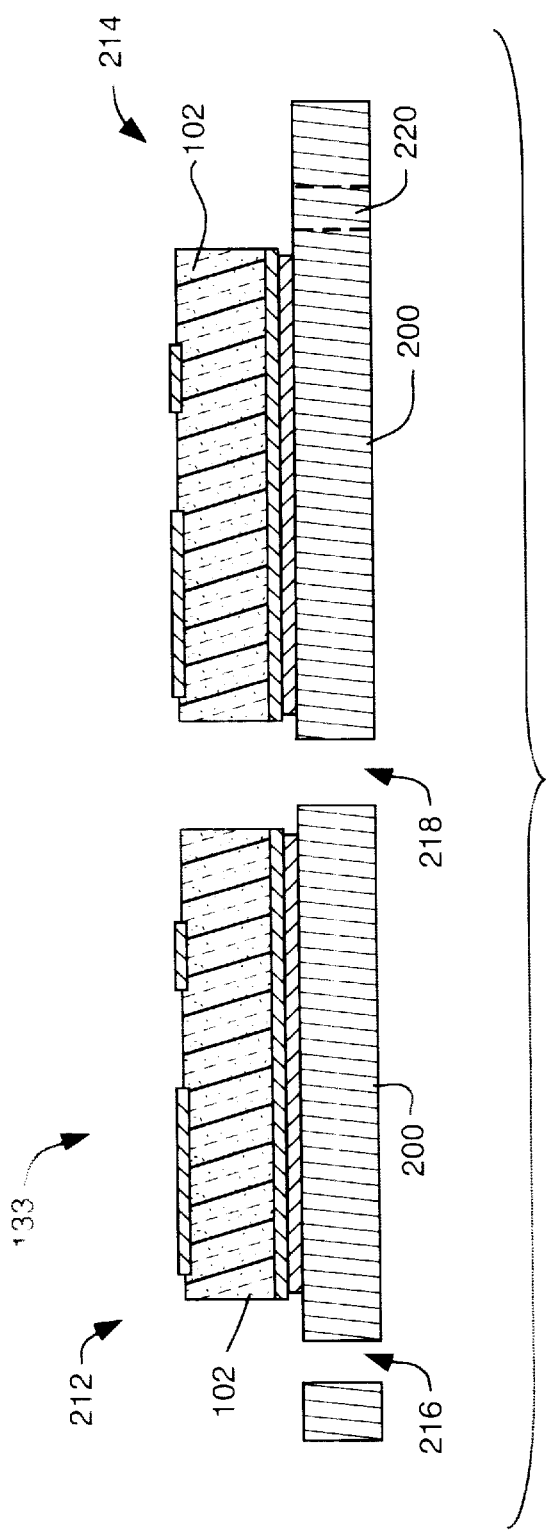
FIG. 18 depicts a step of sawing following the step of FIG. 17.

FIG. 18 depicts the sawing of plate 210 to define individual device 102 package precursors 212 and 214. In FIG. 18, regions 216 and 218 have been sawed, while region 220 has not yet been sawed. Each device precursor 212 and 214 thus comprises a device 102 and spacer 200 pair.

Figure 19:
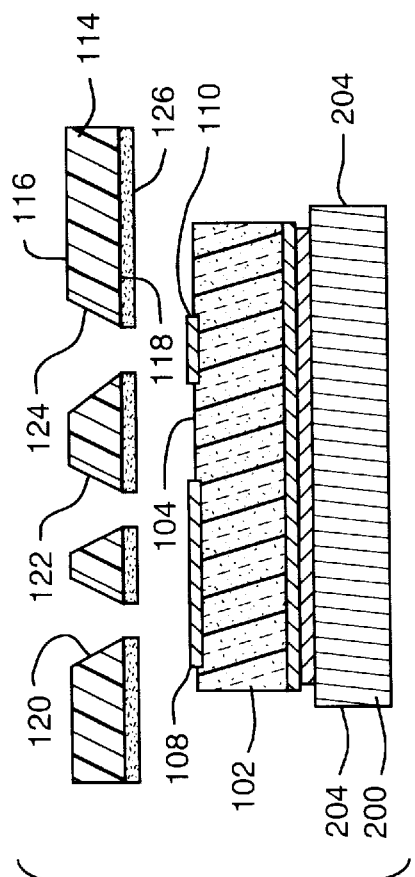
FIG. 19 depicts a method step that follows FIG. 18, prior to further processing.

In FIG. 19, which is comparable to FIGS. 2 and 3, the dielectric film 114 is provided, and adhesive layer 126 is deposited on to second side 118 of dielectric film 114. Device 102 and spacer 200 pair are in position to be mounted active major surface 104 down (since the orientation of FIG. 19 is inverted) onto adhesive layer 126 on second side 118 of dielectric film 114. Again, device 102 contact pads 108 and 110 are aligned to preformed through holes 120, 122 and 124 in film 114. Device 102, with spacer 200 attached is bonded in place using a thermal curing cycle, and if required, a vacuum to facilitate removal of entrapped air and outgassing from adhesive 126.

Following the process step illustrated in FIG. 19, a structure indistinguishable from the structure of FIG. 13 results, and processing continues as described hereinabove. In particular, dielectric encapsulant 130 is molded around both semiconductor device 102 and sides 204 of spacer 200 on second side 118 of dielectric film 114.

Figure 20:
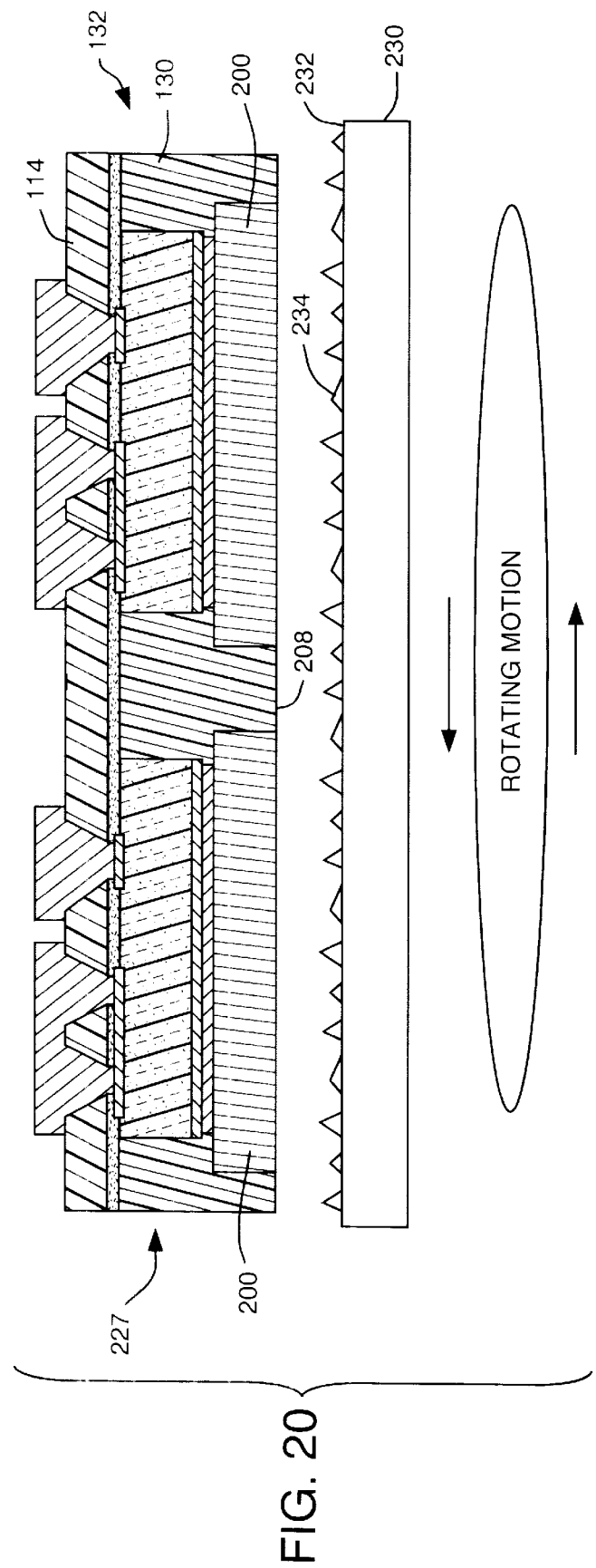
FIG. 20 depicts an initial step in a process embodying the invention, involving mechanical grinding.
Figure 21:
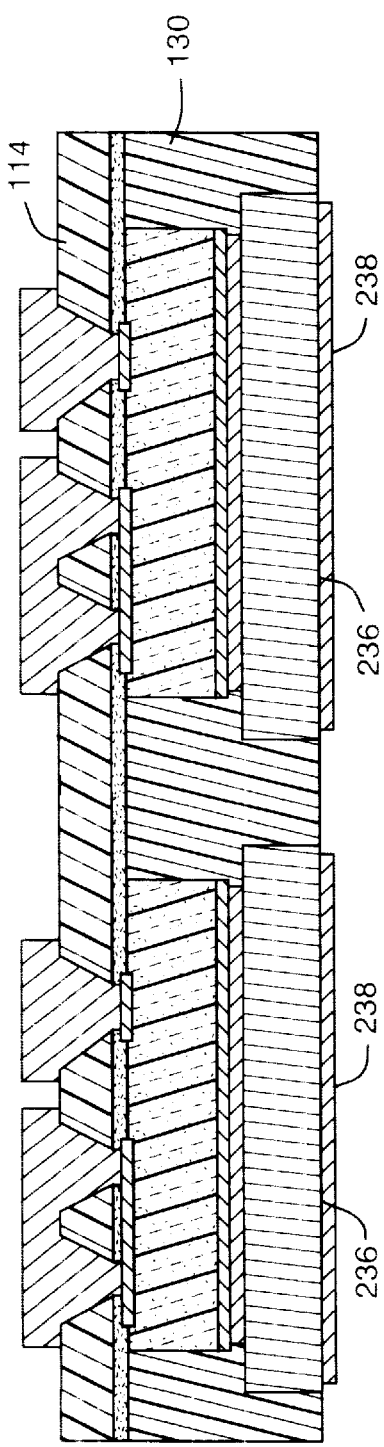
FIG. 21 depicts the resultant structure after grinding.
Figure 22:
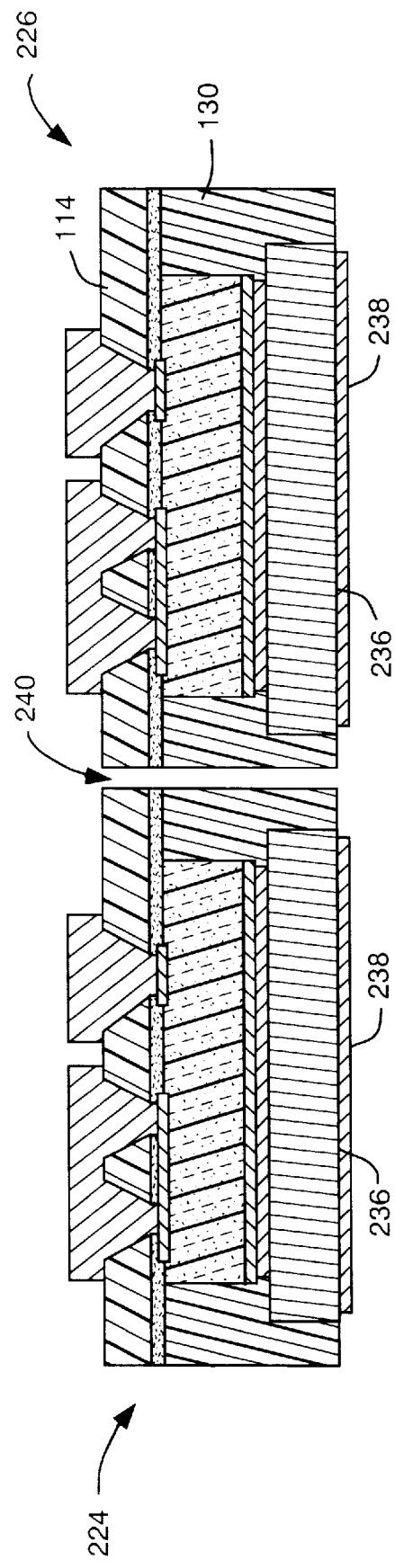
FIG. 22 depicts the structure of FIG. 21 after the devices have been sawed apart.

FIGS. 20–22 depict a process to fabricate a power device package, and preferably a plurality of power device packages 224 and 226, mechanically thinned by grinding. Although the individual power semiconductor devices 102 are illustrated as having approximately the same thickness in the accompanying drawing figures, in practice semiconductor die differ in thickness. The process of FIGS. 20–22 advantageously produces a plurality of semiconductor device packages 224 and 226 of substantially the same thickness, which facilities later assembly into electronic systems, not withstanding the differences in die thickness.

In the embodiments of FIGS. 20–22 through holes 120, 122, and 124 can be formed at an early or a late stage of fabrication. For example, in one embodiment, the grinding and sawing process steps of FIGS. 20–22 follow the process steps of FIGS. 1, 2 and 3, as well as process steps similar to those of FIGS. 13, 14 and 15, wherein holes 120, 122 and 124 through dielectric film 114 are preformed prior to bonding active major surface 104 of device 102 to dielectric film 114. In another embodiment, through holes 120, 122 and 124 through dielectric film 114 are formed after active major surface 104 of device 102 is bonded to dielectric film 114 and, preferably, after encapsulant 130 is molded around device 102 and at least around sides 204 of spacer 200. A laser ablation process or chemical etch process, for example, may be employed to form through holes 120, 122 and 124 after device 102 surface 104 is bonded to dielectric film 114.

In FIG. 20, dielectric encapsulant 130 defining device carrier 132 has been molded entirely around spacers 200, forming a structure 227 having a bottom surface 208 opposite dielectric film 114. Thus in FIG. 16 lower surface 208 is a surface of encapsulant 130, at least prior to grinding. It will however be appreciated that mechanical thinning may as well be employed when encapsulant 130 is molded only around sides 204 of spacer 200, as in FIGS. 14 and 15, in which case lower surface 208 is a surface of spacer 200. In either event, surface 208 may also be termed the structure bottom side 208.

FIG. 20 in particular depicts a mechanical grinding step wherein a mechanical grinding device 230 is employed. Grinding device 230 has a grinding surface 232 containing abrasive particles 234 such as diamond or carbide particles. Grinding device 230 rotates, and particles 234 mechanically grind through back surface 208 of carrier 132 into encapsulant 130, as well as into portions of the thermally and electrically conductive spacers 200. This grinding step both thins carrier 132, and forms a planarized back surface 236.

FIG. 21 depicts carrier 132 after completion of the grinding process. Also illustrated in FIG. 21 is an optional layer of is solder 238 applied to planarized back surface 236, prior to sawing device packages 204 and 206 apart.

FIG. 22 depicts thinned, planarized power device packages 208 and 210 which have been sawed apart at saw line 240 into singulated units, generally as described above with reference to

FIGS. 10–12.

Figure 27:
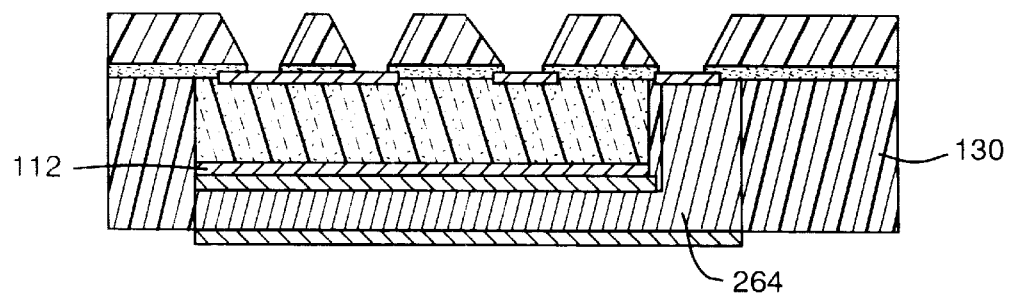
FIG. 27 depicts encapsulation and cleaning steps.
Figure 28:
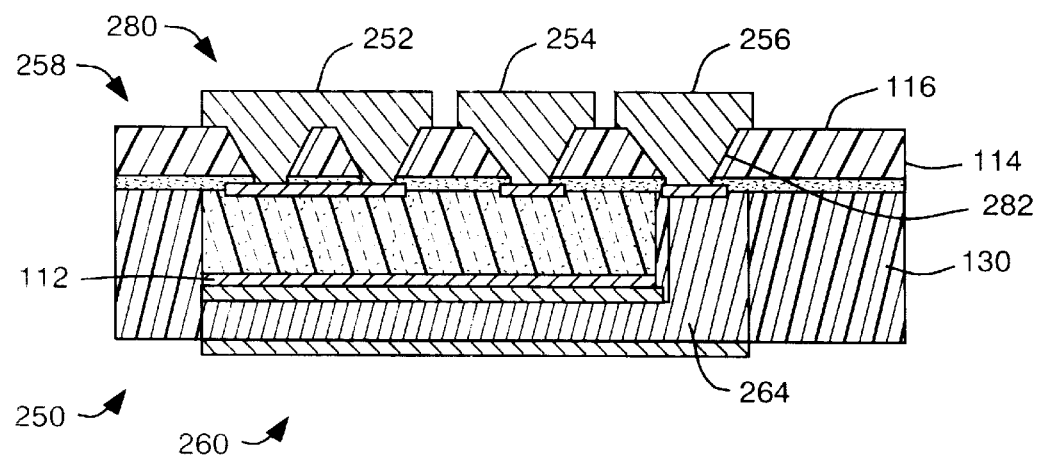
FIG. 28 depicts subsequent metallization steps, and a resultant power device package embodying the invention.
Figure 29:
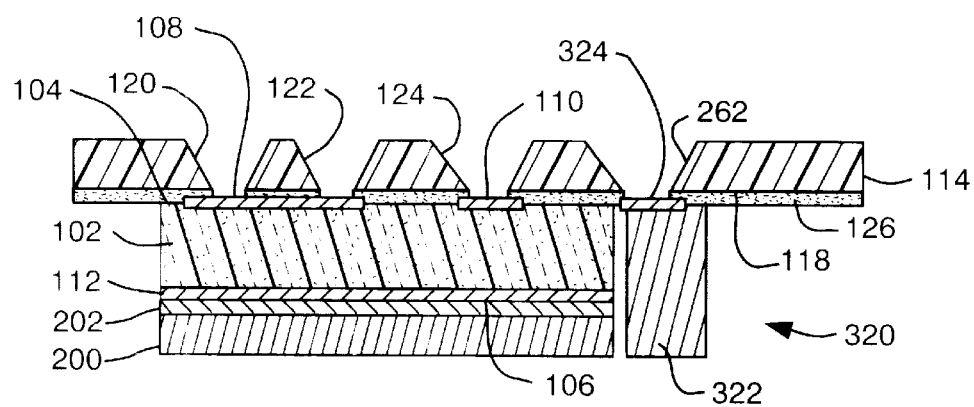
FIG. 29 depicts an intermediate step in yet another process embodying the invention for fabricating a power device package that includes a feed through element.

FIGS. 23–29 depict a process for fabricating a power device package 250 in which all package interconnect regions 252, 254 and 256 are on the top 258 of device package 250 (FIG. 29).

Accordingly bottom 260 of device package 250 can be mounted to a heat sink structure, such as is described hereinbelow with reference to FIG. 43, with no need to provide an electrical connection to bottom side 260. Thus, device main terminal 112 (e.g. drain) on opposite major surface 106 is electrically brought up to top surface 258.

Figure 23:
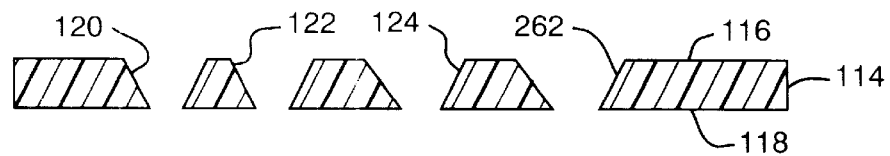
FIG. 23, which is comparable to FIG. 1, depicts an initial step in a process for fabricating a power device package in which all package interconnect regions are on the top of the device package.
Figure 24:
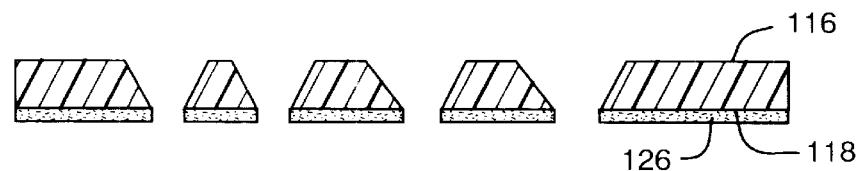
FIG. 24 depicts a process step of applying adhesive, subsequent to the process step of FIG. 23.
Figure 25:
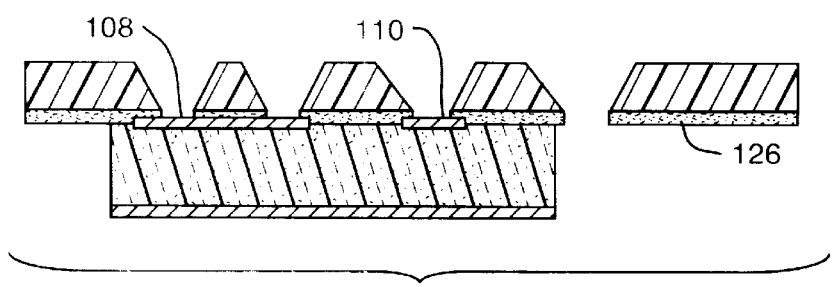
FIG. 25 depicts a subsequent step, comparable to FIG. 3, including the mounting of a semiconductor device.

FIGS. 23, 24 and 25 are similar to FIGS. 1, 2 and 3, differing in that there is an additional series of through holes, represented by through hole 262, to facilitate electrical connection to device main terminal 112 (e.g. drain terminal) on device 102 opposite major surface 106. Thus, in FIG. 23, dielectric film 114 is provided, having first 116 and second 118 sides. Multiple holes, such as representative holes 120, 122, 124 and 262 are formed through dielectric film 114 by any suitable means, such as a mechanical punch process. In FIG. 24, adhesive layer 126 is deposited onto second side 118 of dielectric film 114. In FIG. 25, power semiconductor device 102, still un-packaged, is mounted active major surface 104 down (since the orientation of FIG. 21 is inverted) onto adhesive layer 126 on second side 118 of dielectric film 114. As in FIG. 3, in FIG. 25 device 102 contact pads 108 and 110 and preformed through holes 120, 122 and 124 in film 114 are in alignment.

Figure 26:
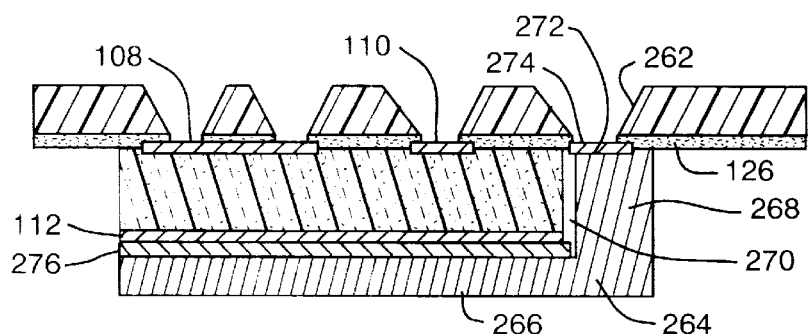
FIG. 26 is a cross-sectional view depicting the attachment of an interposer to the structure of FIG. 25.

However, and with reference to FIG. 26, before bonding device 102 in place, an electrically and thermally conductive interposer 264 is provided. Interposer 264 has a spacing portion 266 configured to extend along terminal contact 112 on opposite major surface 106 of power semiconductor device 102, and a connection portion 268 sized to extend generally parallel to a side surface 270 of power semiconductor device 102 to a termination surface 272 having a contact pad 274. Spacing portion 266 of interposer 264 is bonded to device terminal 112 (e.g. drain terminal) on opposite major surface 106 employing a bonding layer 276. Termination surface 272 is positioned so as to be coplanar with active major surface 104 of device 102, and in contact with adhesive layer 126 in alignment with representative through hole 262. The illustrated interposer 264 is L-shaped in cross-section, although it will be appreciated that other shapes, such as "U" shapes or cavity structures having spacing portion 266 and connection portion 268 may as well be employed.

Although FIGS. 25 and 26 together imply that power semiconductor device 102 is placed on adhesive layer 126 prior to bonding interposer 264 to device terminal 112, device 102 may be bonded to interposer 264 first, and device 102 and interposer 264 then placed onto adhesive layer 126 as a unit. Bonding layer 276 may comprise solder applied as a preform, or as a dispensed layer of solder paste. Alliteratively, bonding layer 276 may comprise a thermally and electrically conductive adhesive.

In any event, device 102 and connection portion 268 of interposer 264 are bonded to dielectric film 114 by means of adhesive layer 126 using a thermal curing cycle, and, if required, a vacuum to facilitate removal of entrapped air and outgassing from adhesive layer 126.

In FIG. 27, which is comparable to FIGS. 4 and 14, dielectric encapsulant 130 is molded around semiconductor device 102 and sides of interposer 264 to form a device carrier. The mechanical grinding process of FIGS. 20–22 may also be employed. Top surface 116 of film 114 and exposed through holes 120, 122, 124 and 262 undergo polymer etch processing to remove any adhesive 126 residue that may have flowed onto the exposed device contact pads 108, 110 and onto exposed contact pad 274 of interposer 264.

In FIG. 28, a patterned electrically conductive layer, generally designated 280 is formed on first side 116 of dielectric film 114. Patterned electrical conductive layer 280 of FIG. 25 is similar to yet differs from patterned electrical conductive layer 136 of FIG. 5 in that the additional package interconnect region 256 which is defined within the FIG. 28 layer 280 serves as a drain package interconnect region. A portion 282 of patterned electrically conductive layer 280 extends into through hole 262 into electrical contact with contact pad 274 on termination surface 272.

Figure 30:
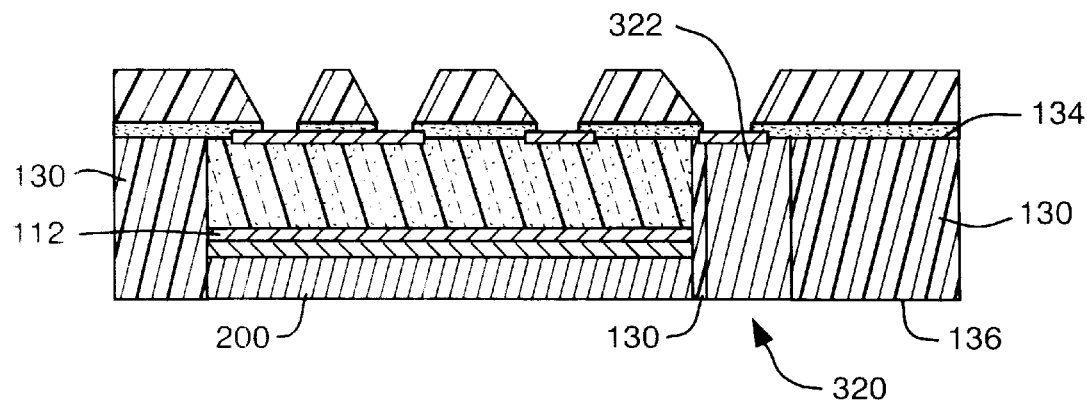
FIG. 30 depicts a step of encapsulating the structure of FIG. 29.
Figure 31:
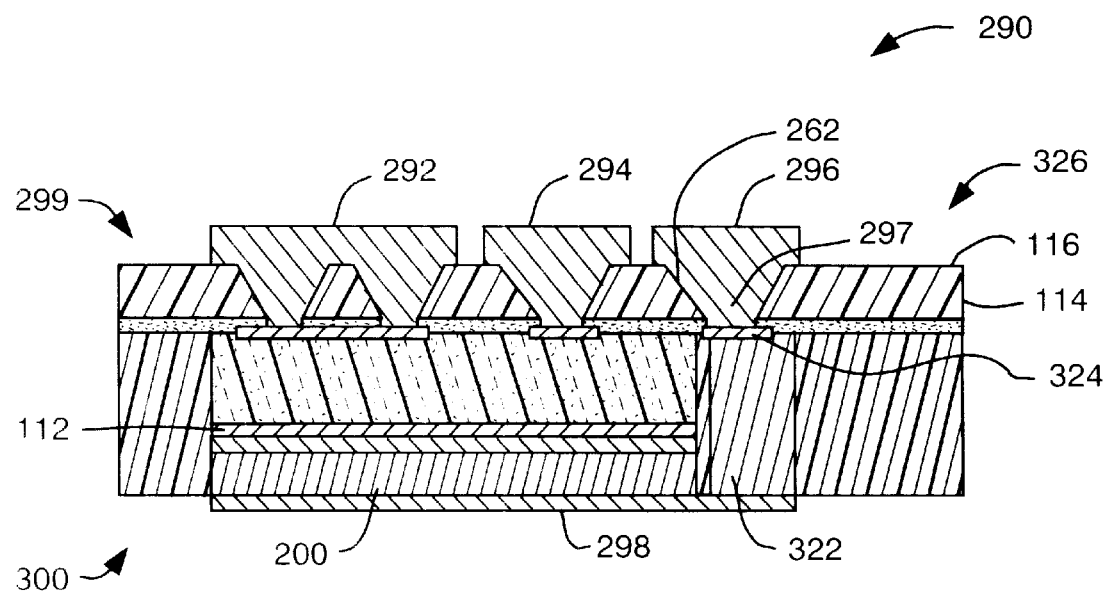
FIG. 31 depicts subsequent metallization steps, as well as a resultant power semiconductor device package.

Referring next to FIGS. 29–31, depicted are portions of another process for fabricating a power device package 290 in which all package interconnect regions 292, 294 and 296 are on top 299 of device package 290. Like the bottom 260 of package 250 of FIG. 28, bottom 300 of device package 290 in FIG. 31 can be mounted to a heat sink structure, such as is described hereinbelow with reference to FIGS. 44 and 45, with no need to provide an electrical connection to bottom side 300. Thus, main device terminal 112 (e.g. drain) on opposite major surface 106 is electrically brought up to top surface 299. The process steps depicted in FIGS. 29–31 are an alternative to the process steps of FIGS. 26, 27 and 28 and, as such, are alternatives that immediately follow the processing steps depicted in FIGS. 23, 24 and 25, described hereinabove.

More particularly, in the embodiment of FIGS. 29–31, an electrically conductive feed through element, generally designated 320, is employed for the purpose of electrically bringing device main terminal 112 (e.g. drain) on opposite major surface 106 to top surface 299, serving a function similar to that of spacing portion 266 of interposer 264 in the embodiment of FIGS. 26–28, described hereinabove. In the embodiment of FIGS. 29–31, feed through element 320 more particularly takes the form of an electrically conductive post 322.

In FIG. 29, as in the embodiments described hereinabove, semiconductor device 102 is mounted active major surface 104 down (since the orientation of FIG. 29 is inverted) onto adhesive layer 126 on second side 118 of dielectric film 114. Device 102 contact pads 108 and 110 are aligned to preformed through holes 120, 122 and 124. In addition, feed through element 320 is positioned so as to be in contact with adhesive layer 126 in alignment with representative through hole 262. Device 102 and feed through element 320 are bonded to second side 118 of dielectric film by means of adhesive layer 126.

Preferably, but optionally, opposite major surface 106, in particular drain contact 112, and spacer 200 are bonded to each other, employing bonding layer 202, as described hereinabove. As in the previous embodiments, device 102 and spacer 200 may be bonded to each other either after device 102 is mounted to dielectric film 114, or before device 102 is mounted to dielectric film 114.

In FIG. 30, dielectric encapsulant 130 is molded around both semiconductor device 102 and sides 204 of spacer 200 on second side 118 of dielectric film 114, and additionally around feed through element 320 comprising through post 322.

Top surface 116 of film 114 and exposed through holes 120, 122, 124 and 324 undergo polymer etch processing to remove any adhesive 126 residue that may have flowed onto exposed device contact pads 108, 110 and onto exposed contact pad 324 of feed through element 320.

In FIG. 31, a patterned electrically and thermally conductive layer, generally designated 326 and comprising package is interconnect regions 292, 294 and 296 is formed on first side 116 of dielectric film 114, by metallization employing a sputter process or an electroless plating process. A thick copper layer is plated up on a seed layer to form the patterned metal interconnect layer 326 over selected areas of top surface 118, into through holes 120, 122 and 124 into electrical contact with device pads 108 and 110, as well as a portion 297 extending into through hole 262 into electrical contact with post contact pad 324. Thus, package interconnect region 296 serves as a drain package interconnect region.

In addition, device 102 opposite major surface 106 comprising device main terminal 112 (e.g. the drain) is electrically connected to feed through element 320, for example, by metallization 298 on device bottom surface 300. Since spacer 200 is employed in the embodiment of FIGS. 29–31, electrical connection to device terminal 112 is through spacer 200. However, it will be appreciated that, in the event spacer 200 is not included, electrical connection is made directly to device terminal 112.

Figure 46:
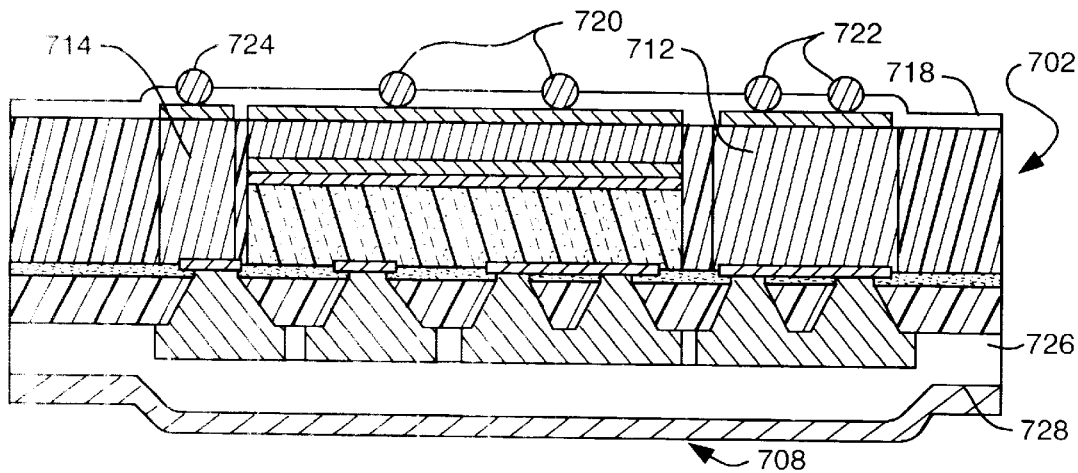
FIG. 46 depicts an intermediate step in a process for mounting a power semiconductor device package to a heat sink wherein a heat sink is attached to the top of the device package, with all electrical connections brought to the back side of the device package.
Figure 47:
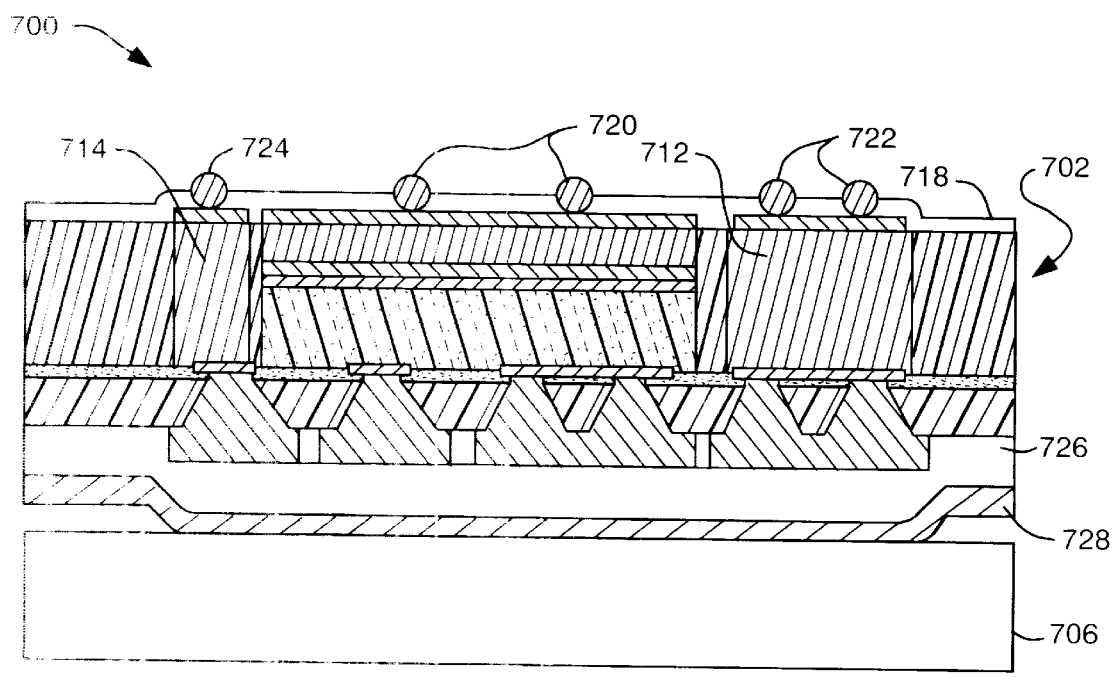
FIG. 47 shows attachment of the structure of FIG. 46 to a heat sink.

In the embodiment of FIGS. 29–31, conductive feed through element 320 is employed to electrically bring drain contact 112 to the top 299 of device package 290, so that all package interconnect regions 292, 294 and 296 are on top, and a heat sink can be mounted to the bottom. However an alternative, described hereinbelow with reference to FIGS. 46 and 47, is to employ a plurality of feed through elements to electrically bring source 108 and gate 110 contacts to the bottom 300 of device package 290 so that all package interconnect regions are on the bottom, and a heat sink can be mounted to the top.

Figure 32:
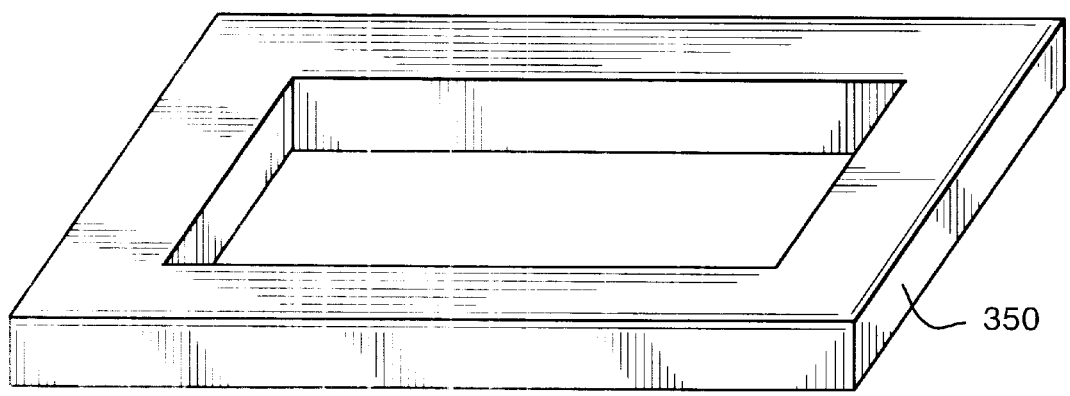
FIG. 32 is a three-dimensional view of an electrically conductive frame structure employed in yet another process and package structure embodying the invention.
Figure 33:
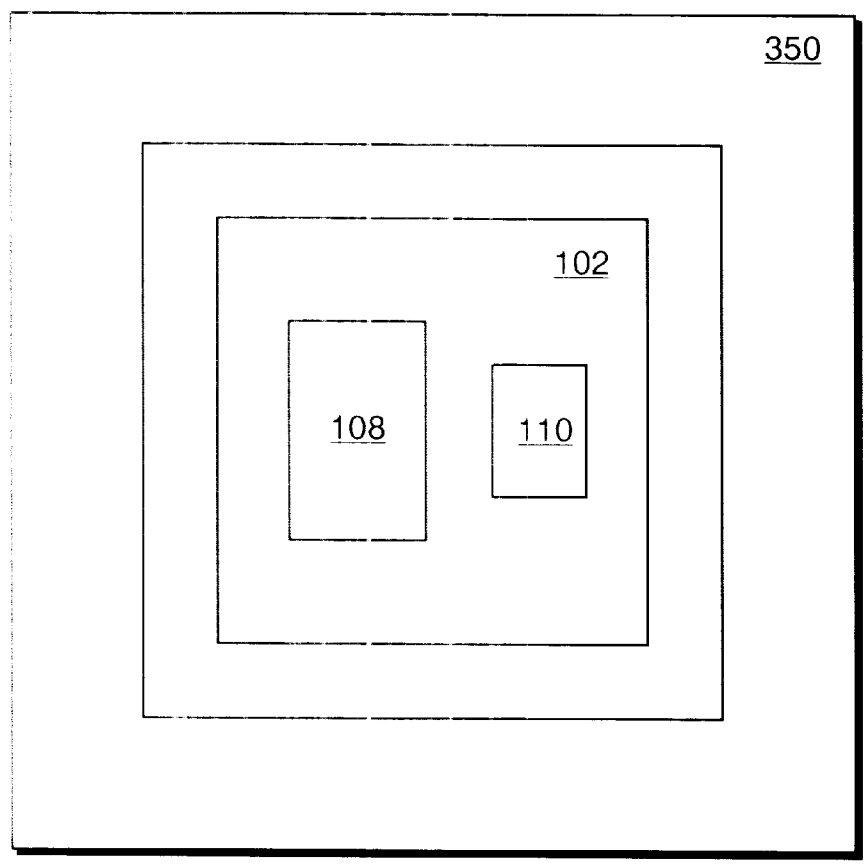
FIG. 33 depicts the frame FIG. 32 in plan view, surrounding a semiconductor device.
Figure 34:
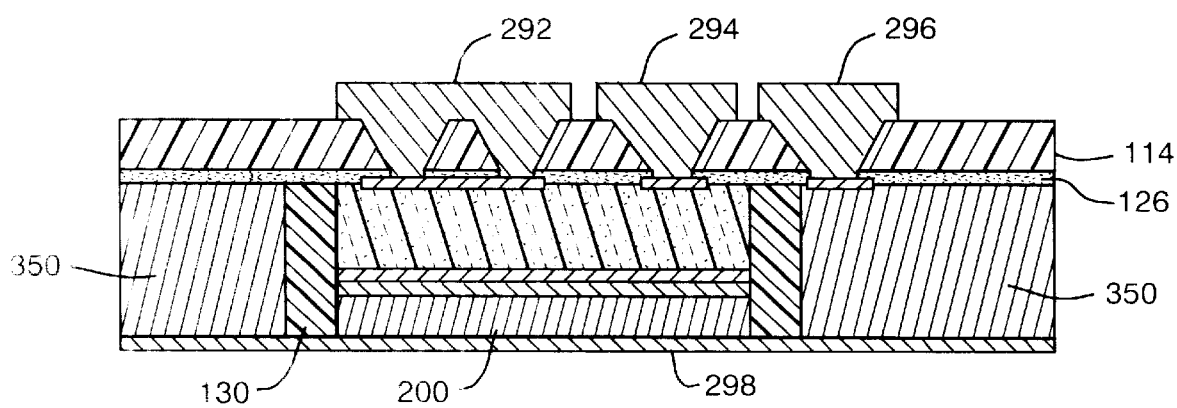
FIG. 34 is a side cross-sectional view depicting the frame of FIGS. 32 and 33 in a packaged device structure.

FIGS. 32–34 illustrate an embodiment where the feed through element generally designated 320 in FIGS. 29–31 more particularly comprises an electrically conductive frame structure 350 that encircles power semiconductor device 102. Thus, FIG. 31 is a three-dimensional view of frame 350 in isolation, FIG. 33 is a diagrammatic plan view depicting the manner in which frame 350 encircles device 102, and FIG. 34 is a cross-sectional view similar to that of FIG. 32, differing however in that feed through element 320 comprises the frame 350.

Processing steps are generally as described hereinabove, including those processing steps described with reference to FIGS. 29–31.

Frame 350 may comprise a single electrically conductive material, or frame 350 may comprise a basic structure of a non-conductive material with electrically-conductive elements (not shown) embedded. A particular advantage of the frame structure 350 of FIGS. 32–34 is that frame 350 provides additional structural integrity, as well as a relatively greater area for carrying electrical current of the device terminal 112. In view of the additional structural integrity provided by frame 350, encapsulant 130 could comprise an elastomer, rather than an epoxy with inorganic particle fill.

Referring next to the embodiment of FIGS. 35–40, depicted are steps for fabricating a power semiconductor device package 390 having a top side 392 and a bottom side 394, and including a plurality of representative power semiconductor devices 402, 404, 406 and 408. The process of FIGS. 35–40 advantageously facilitates fabrication of package 390 employing semiconductor devices 402, 404, 406 and 408 which are of varying thicknesses, as shown. In addition to accommodating power semiconductor devices 402, 404, 406 and 408 of different thicknesses, the resultant device package 390 advantageously is generally flat on both sides 392 and 394, and can accommodate dual heat sinks as is described hereinbelow with reference to FIG. 45. Arrangements of devices having different heights, such as diodes and IGBTs, can be used to form sub-circuits such as half and full bridges that are fundamental building blocks of power circuits.

Figure 36:
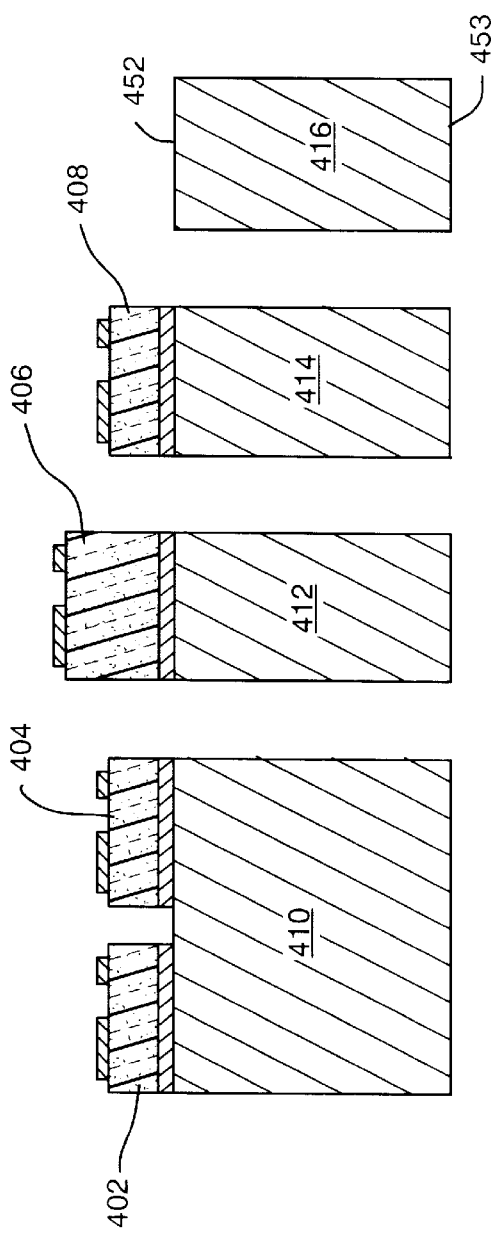
FIG. 36 depicts the structure of FIG. 35 after sawing.

Referring more particularly to FIG. 36, as initial steps in the process power semiconductor devices 402, 404, 406 and 408 are provided, devices 402 and 404 being mounted as a set onto a common electrically and thermally conductive spacer 410, and devices 406 and 408 being mounted onto individually electrically and thermally conductive spacers 412 and 414, respectively. In the case of single common spacer 410 supporting multiple devices 402 and 404, the multiple devices 402 and 404 are of substantially the same thickness, and in the completed package 390 are, for example, connected electrically in parallel to act as a single switch. Also shown in FIG. 36 is a spacer-like structure 416, with no semiconductor device mounted, which structure 416 serves as a through-post 416. Each of the semiconductor devices 402, 404, 406 and 408 has an active major surface 420 and an opposite major surface 422, with representative contact pads 424 and 426 (for example source gate contacts) on active major surface 420, and a terminal contact 428 (for example a drain contact 428) on opposite major surface 422.

Figure 35:
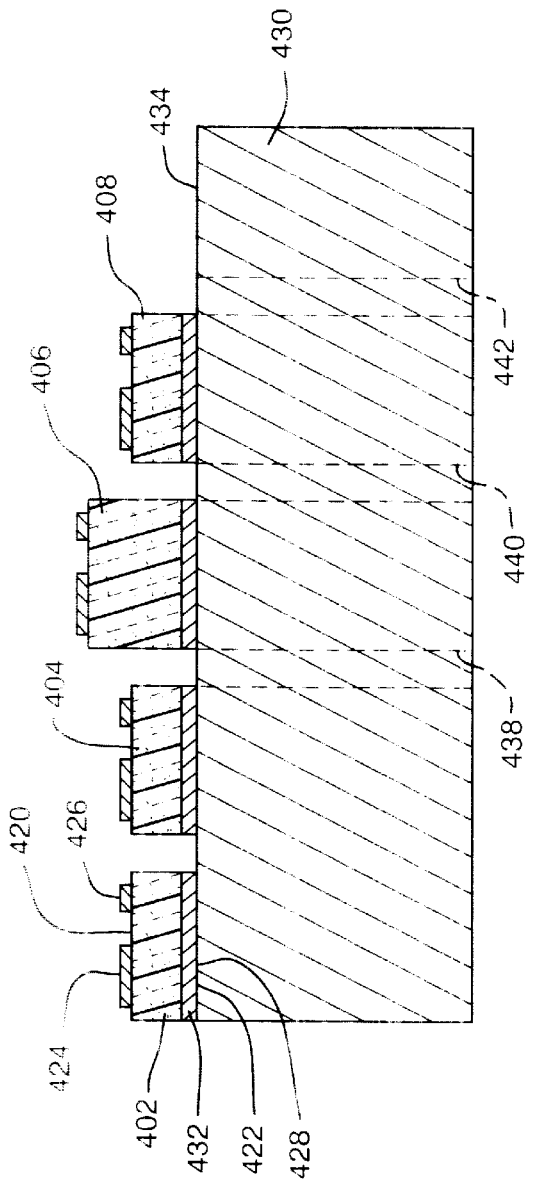
FIG. 35 depicts an initial step in yet another process embodying the invention, showing the attachment of semiconductor devices to a copper plate as an initial step in the fabrication of spacers.

The configuration of FIG. 36 wherein power semiconductor devices 402, 404, 406 and 408 are mounted onto electrically and thermally conductive spacers 410, 412 and 414, is, for example, accomplished as illustrated in FIG. 35 by first attaching devices 402, 404, 406 and 408 to a plate 430 of electrically and thermally conductive material, such as a copper plate 430. Electrically and thermally conductive bonds 432 are formed between lower terminals 428 of devices 402, 404, 406 and 408 and an upper surface 434 of plate 430.

Although a single plate 430 is illustrated in FIG. 35, in order to minimize the amount of grinding that needs to be done later to achieved planarity (described hereinbelow with reference to FIG. 39), a range of plates 430 of varying thicknesses can be provided to accommodate devices 402, 404, 406 and 408 having, for example, small, medium and large heights. For example, a thicker copper plate could be used for mounting very thin power semiconductor devices (e.g. 20 mil thickness), and a thinner copper plate could be used for mounting thicker power devices. Copper is employed in one example for plate 430 because copper has both high electrical and thermal conductivity. However, other materials which provide better mechanical matches to silicon could be used for plate 430.

Shown in dash lines in FIG. 35 are representative saw lanes 438, 440 and 442. Thus, plate 430 is sawed to produce the structures of FIG. 36 wherein devices 402 and 404 are mounted onto common spacer 410, and individual devices 406 and 408 are mounted onto respective spacers 412 and 414.

Figure 37:
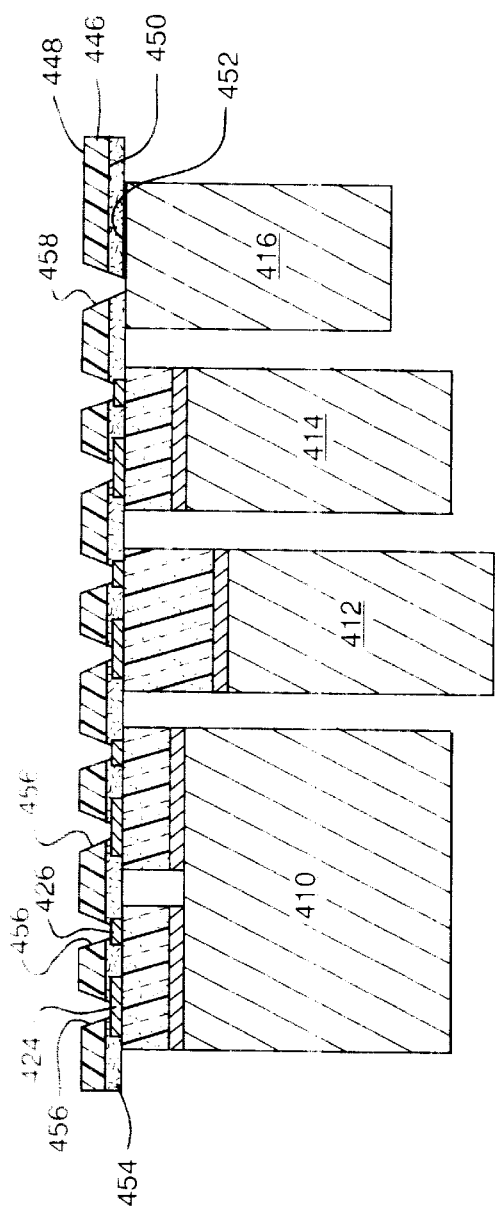
FIG. 37 depicts a subsequent method step involving attachment to a sheet of dielectric film.

In FIG. 37, a dielectric film 446 having first 448 and second 450 sides is provided, and active major surfaces 420 of devices 402, 404, 406 and 408 are bonded to second side 450 of dielectric film 430. In addition, an upper end 452 of through-post 416 (having upper and lower ends 452 and 453) is bonded to second side 450 of dielectric film 446. As a result, contact pads 424, 426 or active major surfaces 420, and end 452 of through-post 416 are in a common plane.

Thus, a thin polymeric adhesive layer 454 is deposited onto second side 450 of dielectric film 446, which second side 450 is on the underside of film 446 in the orientation of FIG. 37, but would be oriented on top during a typical fabrication process. Adhesive layer 454 can be either a thermoset or a thermoplastic polymeric material, preferably a low temperature cure thermoset to minimize high temperature processing.

Representative through holes 456 and 458 are formed through dielectric film 446. Through holes 456 and contact pads 424, 426 are in alignment, and through hole 458 and end 452 of through-post 416 are in alignment.

Representative through holes 456 and 458 may be preformed as has been described hereinabove and as is implied in FIG. 37. Alternatively, representative through holes 456 and 458 may be formed as a subsequent process step after devices 402, 404, 406 and 408 are bonded to dielectric film layer 446.

Figure 38:
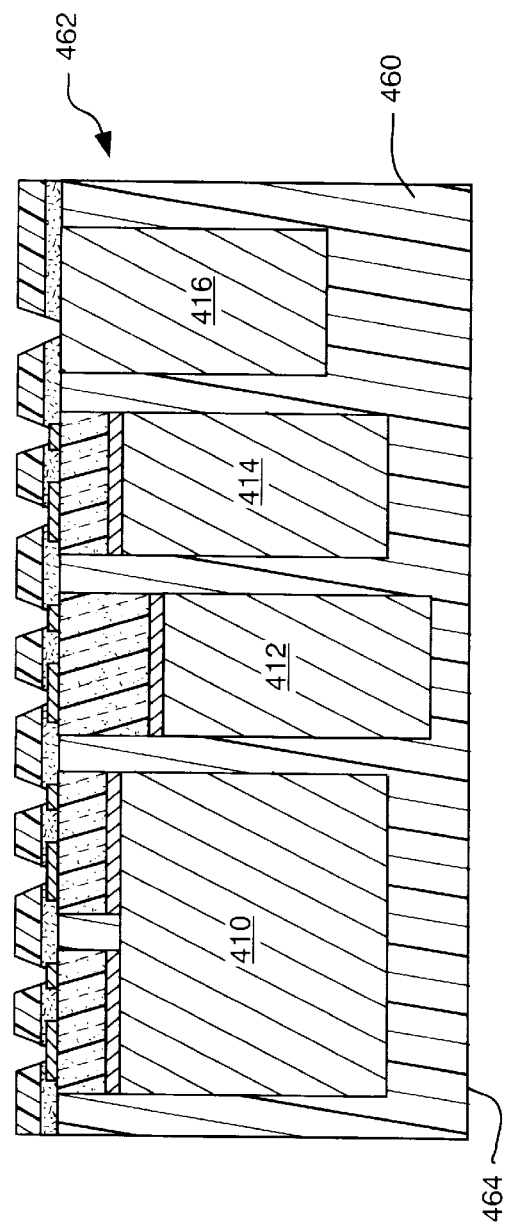
FIG. 38 depicts a subsequent encapsulation step.

In FIG. 38, a dielectric encapsulant 460 is molded around semiconductor devices 402, 404, 406 and 408, around spacers 410, 412, and 414, and around representative through-post 416, forming a structure 462 having an encapsulant lower surface 464 which may also be termed the structure bottom side 464. During a typical encapsulant 460 molding process the structure of FIG. 38 is inverted compared to the illustrated orientation.

Thus, molding material to form dielectric encapsulant 460 is poured or injected into a mold form (not shown) in a manner optimizing environmental conditions such as temperature, atmosphere, voltage and pressure, to minimize voids, stresses, shrinkage and other potential defects. Typically, the process step of molding dielectric encapsulant 460 is performed in a vacuum, preferably at a processing temperature that does not exceed 300° C.

Dielectric encapsulant 460 may comprise a plastic encapsulant such as an epoxy with a high level of inorganic particle fil (such as 70% silica) that is molded around power devices 402, 404, 406 and 408, spacers 410, 412 and 414, and through-post 416 and thermally cured (or cured with another process such as UV light cure or microwave cure) to form a protective structure for the resultant device package 440. Encapsulant 460 does not need to possess any special thermal impedance characteristics. It should, however, provide sufficient electrical insulation.

Figure 39:
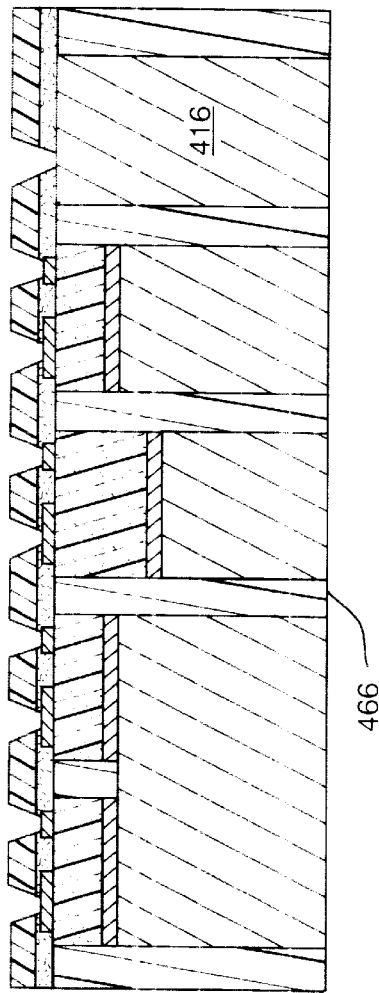
FIG. 39 depicts the result of planarization.

With reference to FIG. 39, a mechanical grinding device is can be employed as is described hereinabove with reference to FIG. 20, to grind structure 462 from bottom side 464, exposing spacers 410, 412 and 414, exposing through-post 416, and forming a planar bottom surface 466.

Figure 40:
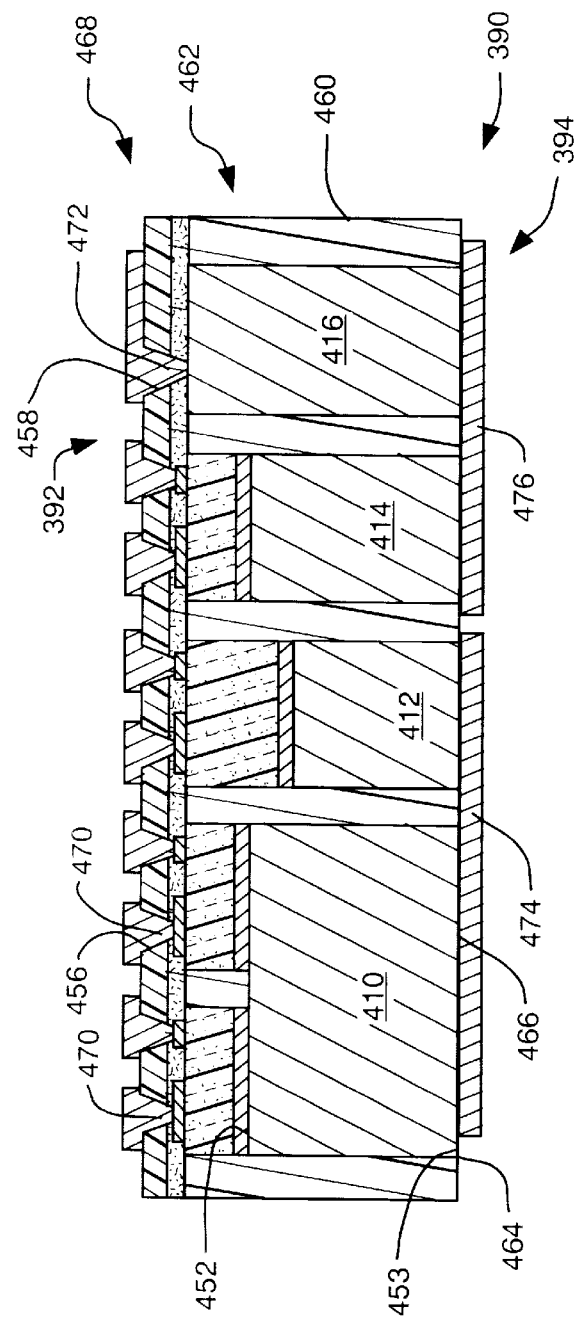
FIG. 40 depicts final processing steps, and a resultant device package.

With reference to FIG. 40, a patterned metal layer 468 is formed on first side 448 of dielectric film 446. Portions 470 and 472 of patterned metal layer 468 extend into representative through hole 456 in electrical contact with contact pads 424 and 426, as well as into through hole 458 in electrical contact with through-post 416.

More particularly, in the process step of FIG. 40, the top side is prepared for metallization, including forming representative through holes 456 and 468 by laser ablation, if not already present. A cleaning process, such as ion sputtering and wet cleaning, is used to remove any residue, prior to depositing a thin layer of Ti or similar barrier metallization to promote adhesion. Copper is deposited and then sputtered to a given thickness, for example, within the approximate range of 1 to 5 microns, followed by a copper plating process to produce the final thickness, up to 10 mils. The metallization 468 is then patterned using conventional processing for masking and etching to define the top side metal configuration.

In addition, back side metallization 474 and 476 can be formed to provide electrical and thermal connections to spacers 410, 412 and 414, as well as to through-post 416. Back side metallization 474 and 476 may be formed in the manner similar to the top side metallization 468. Alternatively, one or more copper plates 474 and 476 may be soldered to the spacers 410, 412 and 414, as well as to through-post 416. The resultant package structure 390 of FIG. 40 is a planar module, with metallization on the top and bottom.

In the structure of FIG. 40, a single through-post 416 is employed to bring all electrical connections to the top side. Alternatively, through-posts can be employed to bring all electrical connections to the bottom side.

Subsequent steps are to attach lead frames, or provide solder interconnections that will allow structure 390 to be electrically connected to an external circuit, and then to attached heat sinks as needed.

Alternatively, back side connections can be made by soldering an etched copper plate, or a copper on ceramic or direct bond copper substrate to the back side. If a heat sink is eventually attached to the back side, some form of electrical insulation is applied over metallization 474 and 476. Direct bond copper attached to a substrate can provide such insulation. In addition, such insulation can be provided by co-therm, or a deposited insulator such as diamond-like carbon (DLC).

Figure 41:
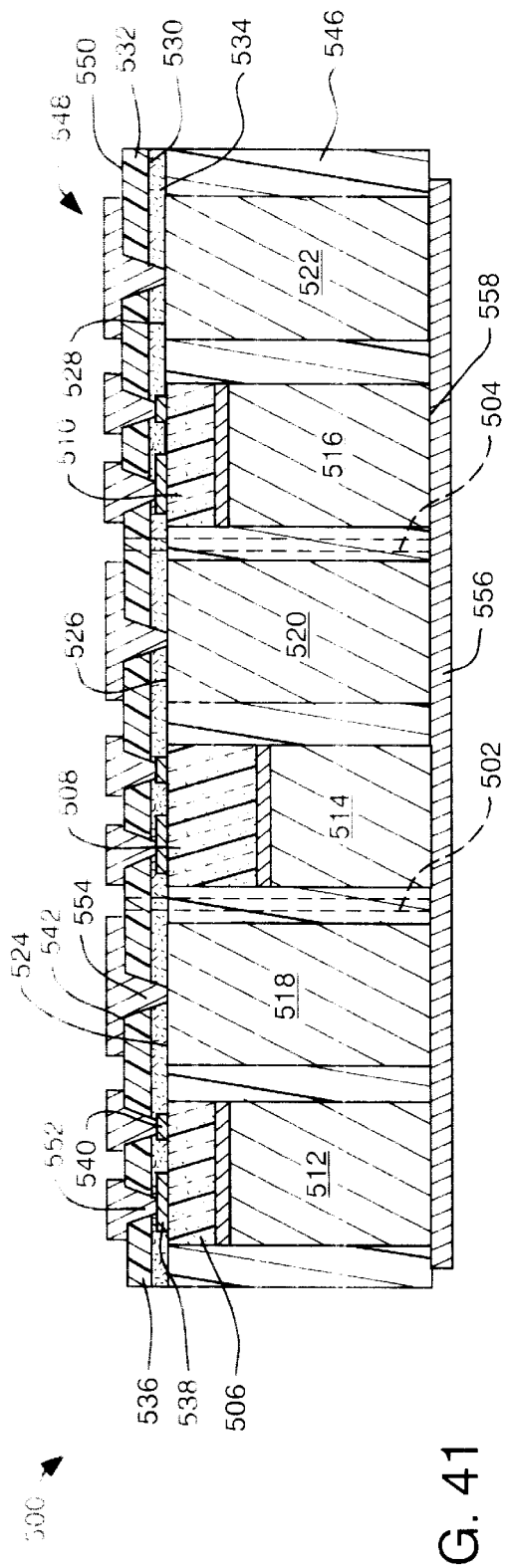
FIG. 41 depicts an intermediate step in a variation of the process of FIGS. 35–40, which results in the production of a batch of single-device packages.
Figure 42:
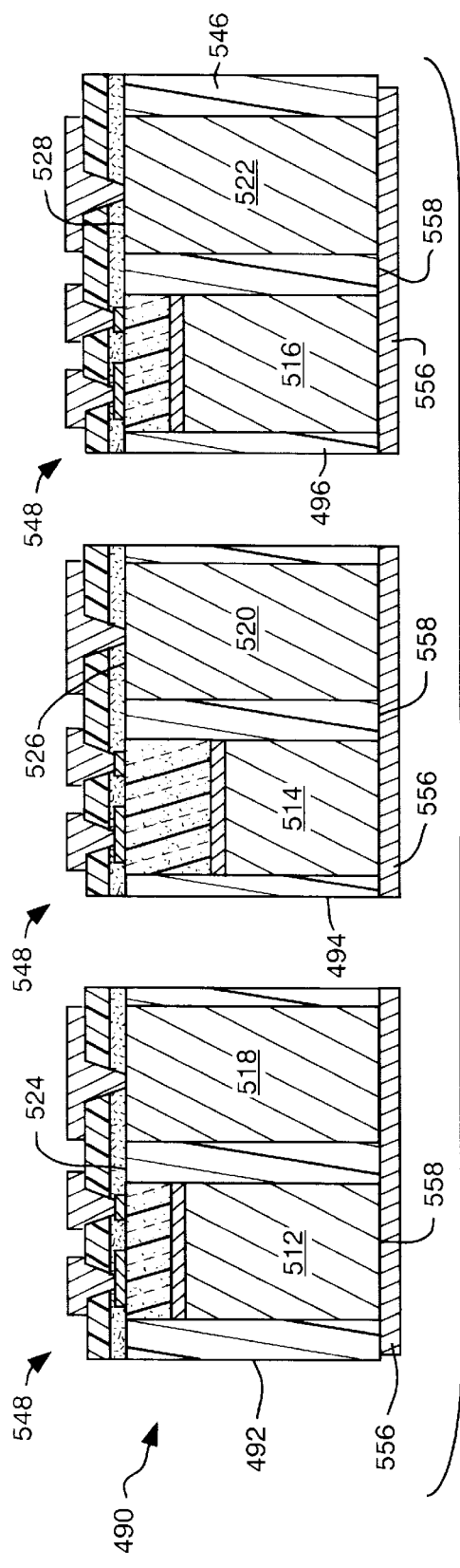
FIG. 42 depicts the resultant batch of single-device packages.

FIGS. 41 and 42 depict a variation of the process of FIGS. 35–40, which variation results in the production of a batch 490 of single-device packages 492, 494 and 496 having thicknesses that match within a predetermined tolerance. FIG. 41 depicts a structure 500 comparable to the device package 390 or structure 462 of FIG. 40, but also including representative saw lanes 502 and 504 along which structure 500 is sawed to produce batch 490, in a manner similar to that which is described hereinabove with reference to FIGS. 10–12.

More particularly, and in the same manner described hereinabove with reference to FIG. 40, structure 500 of FIG. 41 comprises devices 506, 508 and 510 (which can have different thicknesses as illustrated) mounted onto respective electrically and thermally conductive spacers 512, 514 and 516. In addition, there are electrically conductive through-posts 518, 520 and 522 corresponding to individual ones of the devices 506, 508 and 510, and having representative ends 524, 526 and 528. Devices 506, 508 and 510 are bonded to second side 530 of dielectric film 532, employing adhesive layer 534. Ends 524, 526 and 528 of through-posts 518, 520 and 522 are likewise bonded to second side 530 of dielectric film 532 adjacent their respective corresponding devices 512, 514 and 516. Representative through holes 536 and device contact pads 538 and 540 are in alignment, as are through holes 542 and ends 524, 526 and 528 of through-posts 518, 520 and 522. Encapsulant 546 is molded around the sides of devices 506, 508 and 510, around spacers 512, 514 and 516, and around through-posts 518, 520 and 522. Structure 500 has been planarized by mechanical grinding as described hereinbelow and as represented in FIG. 39. Patterned metallization 548 is formed on first side 550 of dielectric film 532, including portions 552 extending through holes 536 into electrical contact with contact pads 538 and 540, and portions 554 extending through holes 542 into electrical contact with ends 524 526 and 528 of through-posts 518 520 and 522. Metallization 556 is formed on the bottom 558.

Described hereinabove are methods for fabricating power semiconductor device packages, and the resultant package structures or modules. Described next are processes and resultant structures with heat sinks attached. In overview, there are three particular situations, as follows: (1) A heat sink can be mounted on the bottom, and electrical connections taken from the top; (2) The heat sink can be mounted on the top, and connections taken from the bottom; or (3) Heat sinks can be mounted top and bottom and electrical connections taken from either the top or bottom, or both.

To mount a heat sink on the bottom, electrical isolation can be provided either by a direct bond copper substrate, or by a thin insulating plate such as beryllium oxide. Another alternative is to deposit a thin insulating layer such as diamond-like carbon (DLC). These methods of providing electrical isolation do not affect planarity, and a heat sink can be attached either employing adhesive, or mechanically.

A lead frame can then be attached to the top side using, again, a direct bond copper substrate, or other methods. Alternatively, a solderable interface can be provided on the top side allowing the module to be flip mounted onto a board.

Procedures for mounting a heat sink on top are similar. In this case, all of the electrical contacts have been directed towards the bottom of the module using through-post structures, leaving the top free for isolation and attachment processes. The module can be attached to a standard circuit board with a heat sink attached to the top.

Figure 43:
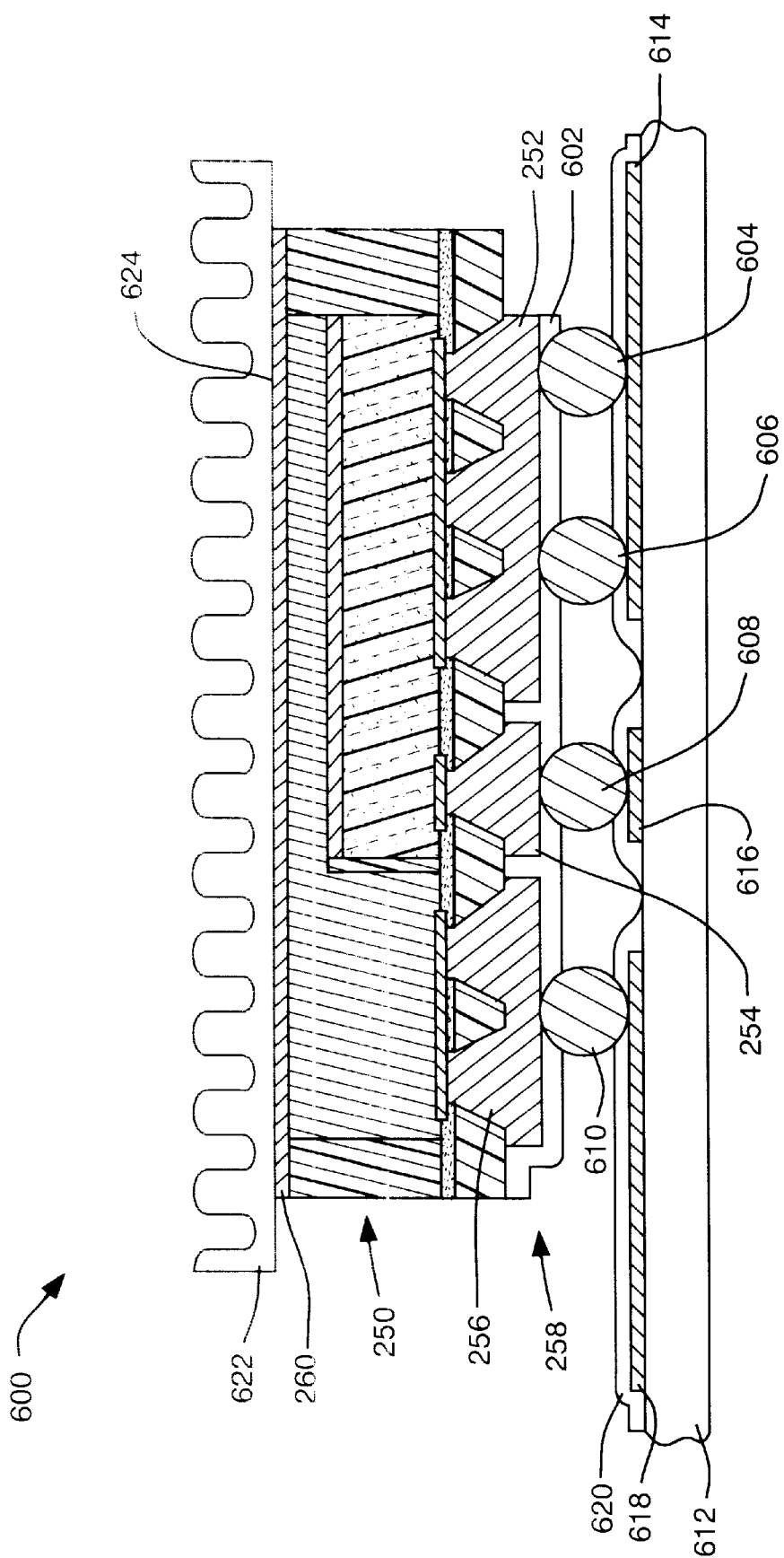
FIG. 43 depicts a power device package mounted in an inverted manner on a printed circuit board, with a heat sink on the back side of the device package.

In one example, as shown in FIG. 43, an exemplary structure 600 has a heat sink mounted on the "bottom" 260 and electrical connections taken from the top 258. Included in structure 600, for example, is power device package 250 of FIG. 28, inverted for mounting purposes. In FIG. 43, a patterned solder mask layer 602 is applied over top 258 of device package 250, just as in the case of patterned solder mask 156 described hereinabove with reference to FIGS. 6 and 7. Solder spheres 604, 606, 608 and 610 for electrical connections to package interconnect regions 252, 254 and 256 are deposited on the top 258 of device package 250, in a manner similar to the depositing solder spheres 182 and 184 as described hereinabove with reference to FIG. 8.

In FIG. 43, a suitable printed wiring board substrate 612 is provided, which may comprise a conventional printed circuit board with conductors 614, 616 and 618, or a ceramic substrate 612 with direct bond copper conductors 614, 616 and 618. A solder mask layer 620 is provided, having openings corresponding to the solder spheres 604, 606, 608 and 610. The structure 600 is heated to a suitable temperature, and electrical connections are accordingly made between package interconnect regions 252, 254 and 256 and the conductors 614, 616 and 618 by reflow solder.

A suitable heat sink 622 is mounted to the bottom 260 of the inverted device package 250, employing a suitable bonding layer 624. Bonding layer 624 may comprise solder or, preferably, a thermally conductive and electrically insulating layer such as co-therm, or diamond-like carbon (DLC), in combination with a suitable adhesive.

Figure 44:
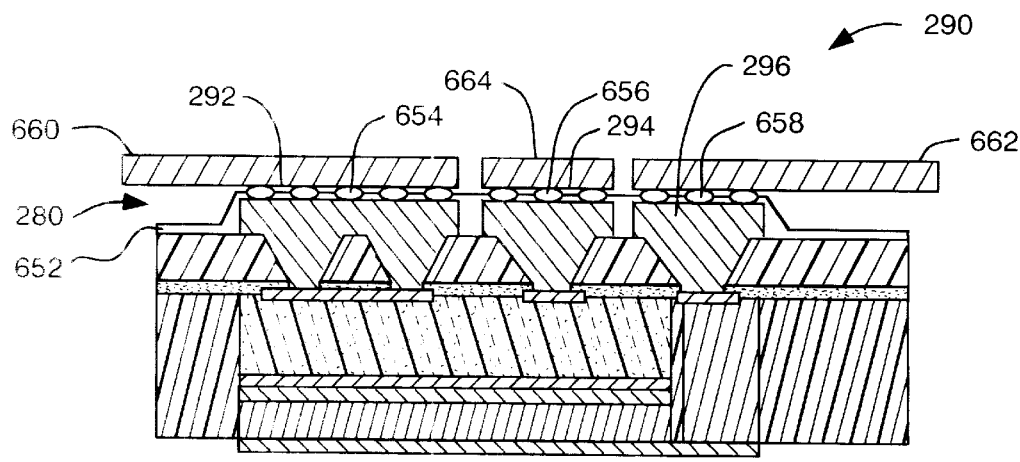
FIG. 44 depicts a power device package with planar top and bottom surfaces, with top side mounted lead frame.
Figure 45:
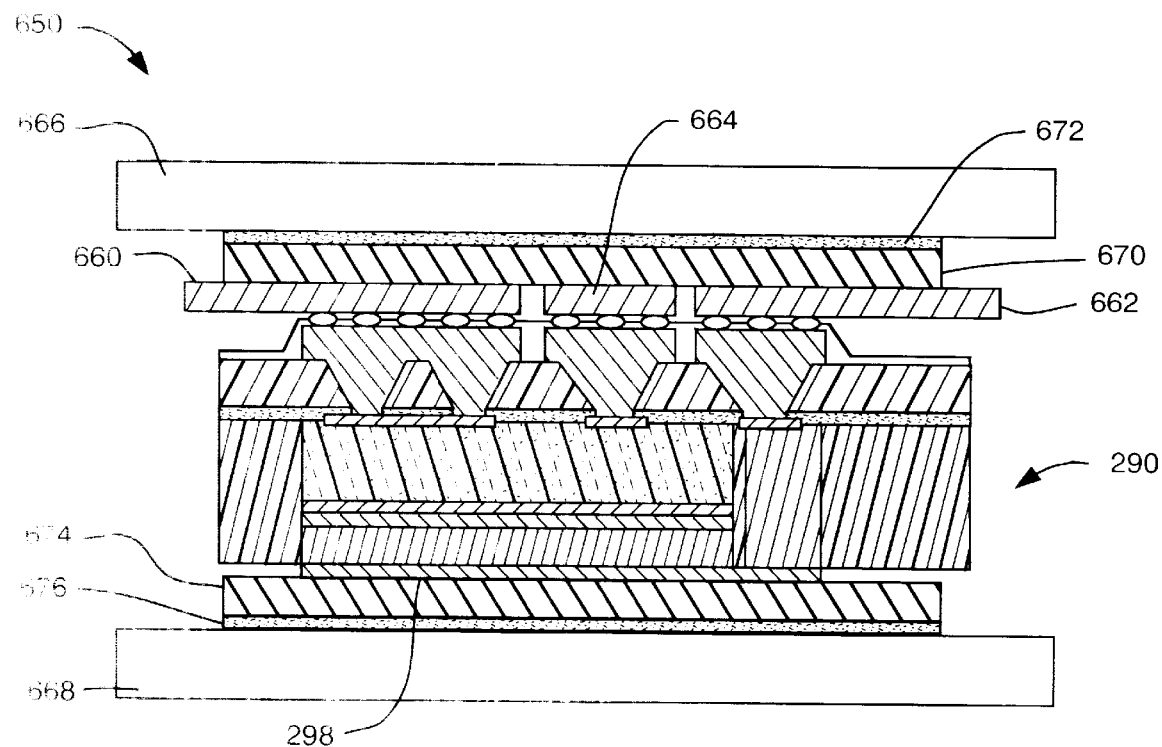
FIG. 45 depicts heat sinks attached to the packaged device of FIG. 44.

Referring next to FIGS. 44 and 45, illustrated is another example of a structure 650 where heat sinks are mounted top and bottom, and electrical connections are taken from the top. FIG. 45 depicts the final structure 650, and FIG. 44 depicts the structure prior to the attachment of suitable heat sinks.

Included in structure 650 is, for example, representative power device package 290 of FIG. 31, as described hereinabove with reference to FIGS. 29–31. In FIG. 44, a patterned solder mask layer 652 is applied over the top surface, with openings for receiving solder spheres 654, 656 and 658 for electrical connection to package interconnect regions 292, 294 and 296. Power leads 260 and 262, which may comprise copper straps 660 and 662, are reflow soldered to package interconnect regions 292 and 296, and a gate lead 664 is reflow soldered to package interconnect regions 294.

As shown in FIG. 45, suitable heat sink structures 666 and 668 are mounted top and bottom. Heat sink structure 666 is mounted to tho top over leads 660, 662 and 664 employing a suitable electrical insulator 670, and a thermally conductive adhesive 672.

Heat sink structure 668 is similarly mounted to the bottom, likewise employing an electrically insulating but thermally conductive layer 674, and a thermally conductive adhesive 676.

FIGS. 46 and 47 depict process steps and a resultant structure 700 which provides for electrical connections from the bottom 708 of the device package (which is inverted in FIGS. 46 and 47), and a heat sink 704 attached to the top 706 of the package 702.

Device package 702 of FIGS. 46 and 47 is comparable to power device package 290 of FIG. 31, differing, however, in that rather than the single through-post 322 of FIG. 31 electrically connected to drain contact 112 by means of an electrical interconnection on the package bottom, in device package 702 there are two through-posts 712 and 714 electrically connected to the device source and gate contacts, respectively, by means of metallization on the top of the device package. An additional difference is that the spacer 200 is not included in the device package 702, but is alternatively can be included.

A patterned solder mask layer 718 is the bottom of device 702 (inverted in FIGS. 46 and 47), with openings in solder mask layer 718 receiving solder spheres 720, 722 and 724 for subsequent connection to the device drain source and gate terminals, respectively. Solder balls 790 are thus electrically connected to the drain terminal, or to a spacer, if provided, while solder spheres 722 and 724 are electrically connected to feed throughs 712 and 714.

A thin layer 726 of electrically insulating, but thermally conductive material is applied over the top side metallization (again inverted in FIGS. 47), following by solder ball metallization 728. In FIG. 47, the structure is solder-attached to the heat sink 706.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a power semiconductor device package comprising:

provinding at least one power semiconductor device having an active major surface and an opposite major surface, with contact pads on the active major surface and a terminal contact on the opposite major surface;

providing a dielectric film having first and second sides, the dielectric film comprising a polymeric film;

forming holes through the dielectric film;

bonding the active major surface of the at least one power semiconductor device to the second side of the dielectric film, with the contact pads in alignment with the holes;

molding a dielectric encapsulant around the at least one semiconductor device on the second side of the dielectric film; and forming a patterned electrically conductive layer on the first side of the dielectric film, portions of the patterned electrically conductive layer extending through the holes as vias into electrical contact with the device contact pads.

2. The method of claim 1, wherein molding the dielectric encapsulant around the at least one semiconductor device forms a device carrier; and the method further comprises mechanically sawing through the encapsulant and the dielectric film to define an extent of the package.

3. The method of claim 1, wherein bonding the major surface of the at least one power semiconductor device to the second side of the dielectric film comprises using an adhesive layer; and wherein the opposite major surface comprises a main terminal of the at least one power semiconductor device; and which method further comprises, prior molding the dielectric encapsulant, bonding an electrically and thermally conductive spacer and the opposite major surface of the at least one power semiconductor device to each other.

4. The method of claim 3, which comprises bonding the spacer and the opposite major surface of the at least one power semiconductor device to each other prior to bonding the major surface of the at least one power semiconductor device to the second side of the dielectric film.

5. The method of claim 1, wherein:

further portions of the patterned electrically conductive layer on the first side of the dielectric film define package interconnect regions; and which method further comprises:

forming a patterned solder mask over the patterned electrically conductive layer on the first side of the dielectric film, with openings in the solder mask defining areas for electrical connection to the package interconnect regions.

6. The method of claim 5, which further comprises applying solder to at least one of the package interconnect regions where exposed through one of the openings in the solder mask.

7. The method of claim 1, wherein bonding the active major surface of the at least one power semiconductor device to the second side of the dielectric film using an adhesive layer; wherein molding the dielectric encapsulant around the at least one semiconductor device forms a device carrier; and wherein the at least one power semiconductor device has a terminal contact on its opposite major surface; and which method further comprises;

bonding an electrically and thermally conductive spacer and the opposite major surface of the at least one power semiconductor device to each other prior to molding a dielectric encapsulant, mechanically grinding a surface opposite the dielectric film, and subsequently mechanically sawing through the encapsulant and the dielectric film to define the extent of the package.

8. The method of claim 1, wherein bonding the active major surface of the at least one power semiconductor device to the second side of the dielectric film comprises using an adhesive layer; and wherein the opposite major surface comprises a main terminal of the at least one power semiconductor device; and which method further comprises, providing an electrically and thermally conductive interposer having a spacing portion configured to extend along the terminal contact on the opposite major surface of the at least one power semiconductor device, and a connection portion configured to extend generally parallel to a side surface of the at least one power semiconductor device to a termination surface, the termination surface positioned so as to be coplanar with the active major surface of the at least one power semiconductor device, and positioned so as to be in contact with the adhesive layer and in alignment with at least one of the holes when the at least one power semiconductor device is bonded to the dielectric film, and bonding the connection portion of the interposer and the opposite major surface of the at least one power semiconductor device to each other.

9. The method of claim 1, which further comprises bonding an electrically conductive feed through element to the second side of the dielectric film, in alignment with at least one of the holes prior to molding the dielectric encapsulant.

10. The method of claim 9, wherein:

the opposite major surface comprises a main terminal of the at least one power semiconductor device; and which further comprises:

electrically connecting the opposite major surface to the feed through element.

11. The method of claim 1, which further comprises bonding an electrically conductive feed through element in the form of an electrically conductive frame that encircles the at least one power semiconductor device to the second side of the dielectric film, in alignment with at least one of the holes prior to molding the dielectric encapsulant.

12. A method of fabricating a power semiconductor device package, comprising:

providing at least one power semiconductor device having an active major surface and an opposite major surface, with contact pads on the active major surface and a terminal contact on the opposite major surface;

bonding an electrically and thermally conductive spacer and the opposite major surface of the at least one power semiconductor device to each other;

providing a dielectric film having first and second sides and holes extending therethrough, the dielectric film comprising a polymeric film;

bonding the active major surface of the at least one power semiconductor device to the second side of the dielectric film, with the contact pads in alignment with the holes;

molding a dielectric encapsulant around the at least one semiconductor device and around at least portions of the spacer on the second side of the dielectric film to form a structure having a structure bottom opposite the dielectric film;

forming a patterned metal layer on the first side of the dielectric film, portions of the patterned metal layer extending through the holes into electrical contact with the device contact pads; and grinding the structure from the structure bottom.

13. The method of claim 12 wherein grinding the structure from the structure bottom includes grinding the spacer.

14. A method of fabricating a power semiconductor device package, comprising:

providing a plurality of power semiconductor devices mounted onto electrically and thermally conductive spacers, each of the semiconductor devices having an active major surface and an opposite major surface, with contact pads on the active major surface and a terminal contact on the opposite major surface, the spacers being bonded to the opposite major surfaces of the devices;

providing a dielectric film having first and second sides and holes extending therethrough, the dielectric film comprising a polymeric film;

bonding the active major surfaces of the devices to the second side of the dielectric film, with the contact pads in alignment with the holes;

molding a dielectric encapsulant around the semiconductor devices and spacers on the second side of the dielectric film to form a structure having a structure bottom opposite the dielectric film;

grinding the structure from the structure bottom to expose the spacers and to provide a planar bottom surface;

forming a patterned metal layer on the first side of the dielectric film, portions of the patterned metal layer extending through the holes into electrical contact with the contact pads on the active major surfaces.

15. The method of claim 14, wherein providing the plurality of power semiconductor devices mounted onto electrically and thermally conductive spacers comprises:

attaching the devices to a plate of electrically and thermally conductive material, forming electrically and thermally conductive bonds between the device major surfaces and an upper surface of the plate; and sawing the plate to define the spacers with mounted devices.

16. The method of claim 14, which further comprises:

providing at least one electrically conductive through-post;

bonding one end of the at least one electrically conductive through-post to the second side of the dielectric film prior to molding the dielectric encapsulant; and wherein during grinding the at least one through-post is exposed; and a hole of the dielectric film and the one end of the at least one through-post are in alignment.

17. The method of claim 16, wherein the patterned metal layer on the first side of the dielectric film provides thermal and electrical connections to the device contact pads and electrically connects the device contact pads to the at least one through-post; and which further comprises:

providing a thermally conductive electrically insulating layer over the patterned metal layer on the first side of the dielectric film; and mounting a heat sink to the thermally conductive electrically insulating layer.

18. The method of claim 14, wherein at least some of the power semiconductor devices are individually mounted onto separate spacers.

19. The method of claim 14, wherein at least some of the power semiconductor devices are mounted onto a common spacer.

20. The method of claim 14, which further comprises sawing through the structure between individual ones of the power semiconductor devices to produce a batch of single-device packages having thicknesses that match within a predetermined tolerance.

21. The method of claim 14, which further comprises:

providing a plurality of electrically conductive through-posts corresponding to individual ones of the plurality of power semiconductor devices;

bonding one end of each of the electrically conductive through-posts to the second side of the dielectric film adjacent to the corresponding one of the plurality of power semiconductor devices prior to molding the dielectric encapsulant; and wherein during grinding the through-posts are exposed; and a respective hole and the one end of each of the through-posts are in alignment; and which further comprises sawing through the structure to produce a batch of single-device packages each including a power semiconductor device and a through-post, the packages having thicknesses that match within a predetermined tolerance.

22. The method of claim 14, which further comprises metallizing the bottom surface of the structure to provide thermal and electrical connections to the spacers.

23. The method of claim 14, which further comprises forming a patterned metal layer on the bottom surface of the structure to provide thermal and electrical connections to the spacers.

24. The method of claim 14, which further comprises soldering at least one metal plate to the spacers on the bottom surface of the structure.

25. The method of claim 14, which further comprises:

providing on the bottom surface of the structure a metal layer to provide thermal and electrical connections to the spacers and to electrically connect the spacers to the at least one through-post, and a thermally conductive electrically insulating layer over the metal layer; and mounting a heat sink to the thermally conductive electrically insulating layer.

26. The method of claim 25, which further comprises coupling leads to the patterned metal layer on the first side of the dielectric film.

* * * * *